(12) United States Patent
Kuwajima et al.

(10) Patent No.: US 8,242,575 B2
(45) Date of Patent: *Aug. 14, 2012

(54) THIN-FILM DEVICE INCLUDING A TERMINAL ELECTRODE CONNECTED TO RESPECTIVE END FACES OF CONDUCTOR LAYERS

(75) Inventors: Hajime Kuwajima, Tokyo (JP); Masahiro Miyazaki, Tokyo (JP); Akira Furuya, Tokyo (JP)

(73) Assignee: TDK Corporation, Tokyo (JP)

( * ) Notice: Subject to any disclaimer, the term of this patent is extended or adjusted under 35 U.S.C. 154(b) by 244 days.

This patent is subject to a terminal disclaimer.

(21) Appl. No.: 12/656,102

(22) Filed: Jan. 15, 2010

(65) Prior Publication Data

US 2010/0116535 A1    May 13, 2010

Related U.S. Application Data

(63) Continuation of application No. 11/723,925, filed on Mar. 22, 2007, now Pat. No. 7,675,136.

(30) Foreign Application Priority Data

Mar. 31, 2006 (JP) .................... 2006-097365

(51) Int. Cl.
*H01L 29/00* (2006.01)
(52) U.S. Cl. .................... 257/528; 257/531; 257/532
(58) Field of Classification Search .................. 257/528, 257/531–533, 536
See application file for complete search history.

(56) References Cited

U.S. PATENT DOCUMENTS

| | | | |
|---|---|---|---|
| 4,801,489 A | 1/1989 | Nakagawa et al. |
| 5,039,965 A | 8/1991 | Higgins, Jr. |
| 5,270,493 A | 12/1993 | Inoue et al. |
| 5,521,564 A | 5/1996 | Kaneko et al. |
| 5,654,681 A | 8/1997 | Ishizaki et al. |
| 5,910,755 A | 6/1999 | Mishiro et al. |
| 6,276,995 B1 | 8/2001 | Matsuta et al. |
| 6,777,620 B1 | 8/2004 | Abe |
| 6,900,708 B2 | 5/2005 | White et al. |

FOREIGN PATENT DOCUMENTS

| | | |
|---|---|---|
| JP | A-02-121313 | 5/1990 |
| JP | A-05-129149 | 5/1993 |
| JP | U-07-010913 | 2/1995 |
| JP | A-10-163002 | 6/1998 |
| JP | A-11-003833 | 1/1999 |
| WO | WO 2006/022098 A1 | 3/2006 |

*Primary Examiner* — Ori Nadav
(74) *Attorney, Agent, or Firm* — Oliff & Berridge, PLC

(57) ABSTRACT

A thin-film device incorporates a device main body and four terminal electrodes. The device main body has four side surfaces. The terminal electrodes are disposed to touch respective portions of the side surfaces. The device main body includes a lower conductor layer that is not used to form a passive element, and an upper conductor layer used to form the passive element. The upper and lower conductor layers include respective lead electrode portions that have respective end faces located at the side surfaces of the device main body. At the side surfaces of the device main body, the end face of the lead electrode portion of the lower conductor layer and the end face of the lead electrode portion of the upper conductor layer are electrically and physically connected to each other. The terminal electrodes touch these end faces and are thereby connected to the upper and lower conductor layers.

2 Claims, 11 Drawing Sheets

THIN-FILM DEVICE INCLUDING A TERMINAL ELECTRODE CONNECTED TO RESPECTIVE END FACES OF CONDUCTOR LAYERS

This is a Continuation of application Ser. No. 11/723,925 filed Mar. 22, 2007. This application claims the benefit of Japanese Patent Application No. 2006-097365, filed Mar. 31, 2006, which is incorporated herein by reference in its entirety.

BACKGROUND

1. Field of the Invention

The present invention relates to a thin-film device incorporating a conductor layer and a terminal electrode connected to the conductor layer.

2. Description of the Related Art

With increasing demands for reductions in dimensions and thickness of high frequency electronic apparatuses such as cellular phones, reductions in dimensions and profile of electronic components mounted on the high frequency electronic apparatuses have been sought. Some of the electronic components have such a configuration that insulating layers and conductor layers are formed on a substrate through the use of thin-film forming techniques. Such electronic components formed through the use of thin-film forming techniques are called thin-film device in the present patent application.

In a thin-film device, terminal electrodes are provided for connecting conductor layers to an external circuit. Here, a portion of the thin-film device other than the terminal electrodes is called a device main body. Each conductor layer connected to the terminal electrodes includes a wiring portion, for example, and is formed so that an end face of the wiring portion is exposed at a side surface of the device main body. In this case, the terminal electrodes are disposed on the side surfaces of the device main body, for example, so as to be connected to the end faces of the wiring portion.

Here is given an example of a method of manufacturing a thin-film device wherein the terminal electrodes are disposed on the side surfaces of the device main body. In the method, first, a thin-film device substructure is fabricated by forming layers such as conductor layers corresponding to a plurality of thin-film devices on a single wafer (a substrate). The substructure includes a plurality of preliminary device main body portions each of which will be a device main body. Furthermore, in the substructure, there are provided portions to be removed between respective adjacent ones of the preliminary device main body portions. Next, the plurality of preliminary device main body portions are separated into a plurality of device main bodies by cutting the substructure at positions of the portions to be removed. By cutting the substructure in such a manner, side surfaces of the device main bodies are formed, and end faces of wiring portions to be connected to terminal electrodes are exposed at the side surfaces. Next, the terminal electrodes are formed on the side surfaces of the device main bodies.

To reduce the dimensions and profile of a thin-film device, it is effective to reduce the thickness of layers such as conductor layers. However, according to the above-described method, a reduction in thickness of conductor layers causes a reduction in areas of the end faces of the wiring portion connected to the terminal electrodes. As a result, the regions in which the conductor layers touch the terminal electrodes are reduced in area, and accordingly it becomes difficult to secure the reliability of connection between the conductor layers and the terminal electrodes.

To avoid this problem, such a technique is conceivable that the wiring portion may be increased in width to thereby increase the area of the end faces of the wiring portion. However, this may cause a problem in the thin-film device that the density of the wiring portion is reduced and therefore it becomes difficult to reduce the dimensions of the thin-film device, or that the impedance of the wiring portion deviates from a desired value and the characteristics of the thin-film device are thereby degraded. Another problem is that there occurs an increase in area of the region of the thin-film device in which the wiring portion is located, and it is therefore difficult to reduce the dimensions of the thin-film device and the area occupied by the thin-film device.

JP 10-163002A discloses a technique wherein, in a chip-shaped electronic component in which an inner conductor film is disposed on a substrate and external terminal electrodes are connected to end faces of the inner conductor film, the end faces of the inner conductor film are tilted with respect to a sectional surface of the substrate.

JP 11-003833A discloses a technique wherein, in an electronic component in which electrodes are disposed on a substrate and external terminals are connected to end faces of the electrodes, the end faces of the electrodes on the substrate are tilted with respect to sectional end faces of the substrate.

JP 2-121313A discloses a thin-film capacitor wherein three or more inner electrode layers and two or more dielectric layers are alternately stacked on a substrate, and outer electrodes connected to the inner electrode layers are disposed on side surfaces of the substrate. JP 2-121313A discloses a technique wherein two of the inner electrode layers forming one of electrodes of a single capacitor in a circuit are laid over each other in a neighborhood of one of the side surfaces of the substrate, and one of the outer electrodes is connected to the portions of the two inner electrode layers laid over each other.

JP 5-129149A discloses a thin-film capacitor wherein four inner electrodes and four dielectric thin films are alternately stacked on a substrate, and outer electrodes connected to the inner electrodes are disposed on side surfaces of the substrate. JP 5-129149A discloses a technique wherein two of the inner electrodes forming one of electrodes of a single capacitor in a circuit are laid over each other in a neighborhood of the side surfaces of the substrate, and the outer electrodes are connected to the portions of the two inner electrodes laid over each other.

In the following description the external terminal electrodes of JP 10-163002A, the external terminals of JP 11-003833A, and the external electrodes of JP 2-121313A and JP 5-129149A are all called terminal electrodes.

As previously described, in a thin-film device in which terminal electrodes are disposed on the side surfaces of the device main body, a reduction in thickness of conductor layers causes a reduction in areas of the end faces of the wiring portion connected to the terminal electrodes, and as a result, the regions in which the conductor layers touch the terminal electrodes are reduced in area and accordingly it becomes difficult to secure the reliability of connection between the conductor layers and the terminal electrodes.

According to the technique disclosed in JP 10-163002A or JP 11-003833A, it is possible to increase the areas of the regions in which the conductor layers touch the terminal electrodes, but the amount of increase in the areas is very small. It is therefore difficult to secure a satisfactory degree of reliability of connection between the conductor layers and the terminal electrodes through the use of the technique disclosed in JP 10-163002A or JP 11-003833A.

According to the technique disclosed in JP 2-121313A or JP 5-129149A, it is possible to increase the areas of the regions in which the conductor layers touch the terminal electrodes, compared with the case in which the terminal electrodes touch only the end face of one of the conductor layers. However, the technique disclosed in JP 2-121313A or JP 5-129149A is applicable only to cases in which there are a plurality of conductor layers forming one of electrodes of a single capacitor in the circuit. It is difficult to reduce the size and profile of the thin-film device when there are a plurality of conductor layers forming one of electrodes of a single capacitor in the circuit.

SUMMARY

It is an object of the invention to provide a thin-film device incorporating a conductor layer and a terminal electrode connected to the conductor layer, the thin-film device being capable of enhancing the reliability of connection between the conductor layer and the terminal electrode and capable of achieving reductions in size and profile of the thin-film device.

A first thin-film device of the invention incorporates a layered structure and a terminal electrode. The layered structure has a side surface, and includes a plurality of conductor layers disposed at different levels along the direction in which the layers are stacked and an insulating layer disposed between two of the conductor layers located adjacent to each other along the direction in which the layers are stacked. The terminal electrode is disposed to touch the side surface of the layered structure. The layered structure incorporates a first passive element and a second passive element each of which is formed using at least one of the conductor layers. The plurality of conductor layers include a first conductor layer used to form the first passive element, and a second conductor layer used to form the second passive element and disposed at a level different from a level at which the first conductor layer is disposed along the direction in which the layers are stacked. At the side surface of the layered structure, an end face of the first conductor layer and an end face of the second conductor layer are electrically and physically connected to each other, and the terminal electrode touches the end face of the first conductor layer and the end face of the second conductor layer and is thereby connected to the first and second conductor layers.

According to the first thin-film device of the invention, at the side surface of the layered structure, the terminal electrode touches the end face of the first conductor layer and the end face of the second conductor layer that are electrically and physically connected to each other, and is thereby connected to the first and second conductor layers.

In the first thin-film device of the invention, the first and second passive elements may be capacitors different from each other or inductors different from each other. Since two capacitors forming a parallel circuit by themselves can be treated as a single capacitor in a circuit, such two capacitors are not included in the 'capacitors different from each other' as the first and second passive elements of the invention.

In the first thin-film device of the invention, the maximum number of the conductor layers aligned along the direction in which the layers are stacked may be two.

A second thin-film device of the invention incorporates a layered structure and a terminal electrode. The layered structure has a side surface, and includes a plurality of conductor layers disposed at different levels along the direction in which the layers are stacked and an insulating layer disposed between two of the conductor layers located adjacent to each other along the direction in which the layers are stacked. The terminal electrode is disposed to touch the side surface of the layered structure. The layered structure incorporates a passive element formed using at least one of the conductor layers. The plurality of conductor layers include a first conductor layer used to form the passive element, and a second conductor layer that is not used to form the passive element and disposed at a level different from a level at which the first conductor layer is disposed along the direction in which the layers are stacked. At the side surface of the layered structure, an end face of the first conductor layer and an end face of the second conductor layer are electrically and physically connected to each other, and the terminal electrode touches the end face of the first conductor layer and the end face of the second conductor layer and is thereby connected to the first and second conductor layers.

According to the second thin-film device of the invention, at the side surface of the layered structure, the terminal electrode touches the end face of the first conductor layer and the end face of the second conductor layer that are electrically and physically connected to each other, and is thereby connected to the first and second conductor layers.

In the second thin-film device of the invention, the maximum number of the conductor layers aligned along the direction in which the layers are stacked may be two.

According to the first or second thin-film device of the invention, at the side surface of the layered structure, the terminal electrode touches the end face of the first conductor layer and the end face of the second conductor layer that are electrically and physically connected to each other, and is thereby connected to the first and second conductor layers. As a result, according to the invention, it is possible to increase the area of the region in which the conductor layers touch the terminal electrode and to thereby enhance the reliability of connection between the conductor layers and the terminal electrode. Furthermore, according to the invention, the first and second conductor layers used to form a surface connected to the terminal electrode are not the layers used to form an identical passive element. Therefore, according to the invention, in order to form the surface connected to the terminal electrode, it is not necessary to make the number of conductor layers used to form a single passive element greater than required, and it is thereby possible to reduce the size and profile of the thin-film device.

In the first or second thin-film device of the invention, in the case where the maximum number of the conductor layers aligned along the direction in which the layers are stacked is two, it is possible to reduce the size and profile of the thin-film device in particular.

Other and further objects, features and advantages of the invention will appear more fully from the following description.

DETAILED DESCRIPTION OF EMBODIMENTS

[First Embodiment]

Figure 9:
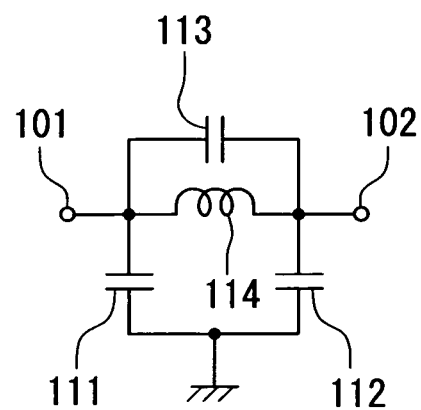
FIG. 9 is a schematic diagram illustrating the circuit configuration of the thin-film device of the first embodiment of the invention.

Preferred embodiments of the invention will now be described in detail with reference to the accompanying drawings. Reference is now made to FIG. 9 to describe the circuit configuration of a thin-film device of a first embodiment of the invention. FIG. 9 is a schematic diagram illustrating the circuit configuration of the thin-film device of the first embodiment. The thin-film device 1 of the embodiment has a function of a low-pass filter.

As shown in FIG. 9, the thin-film device 1 of the embodiment incorporates: two input/output terminals 101 and 102 for receiving and outputting signals; three capacitors 111, 112 and 113; and one inductor 114. The capacitor 111 has an end connected to the input/output terminal 101, and the other end grounded. The capacitor 112 has an end connected to the input/output terminal 102, and the other end grounded. The capacitor 113 has an end connected to the input/output terminal 101, and the other end connected to the input/output terminal 102. The inductor 114 has an end connected to the input/output terminal 101, and the other end connected to the input/output terminal 102.

Figure 1:
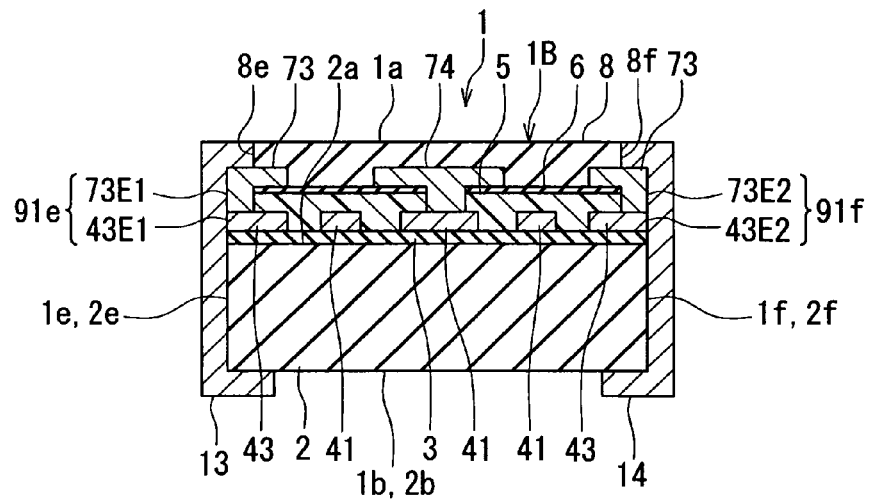
FIG. 1 is a cross-sectional view of a thin-film device of a first embodiment of the invention.
Figure 2:
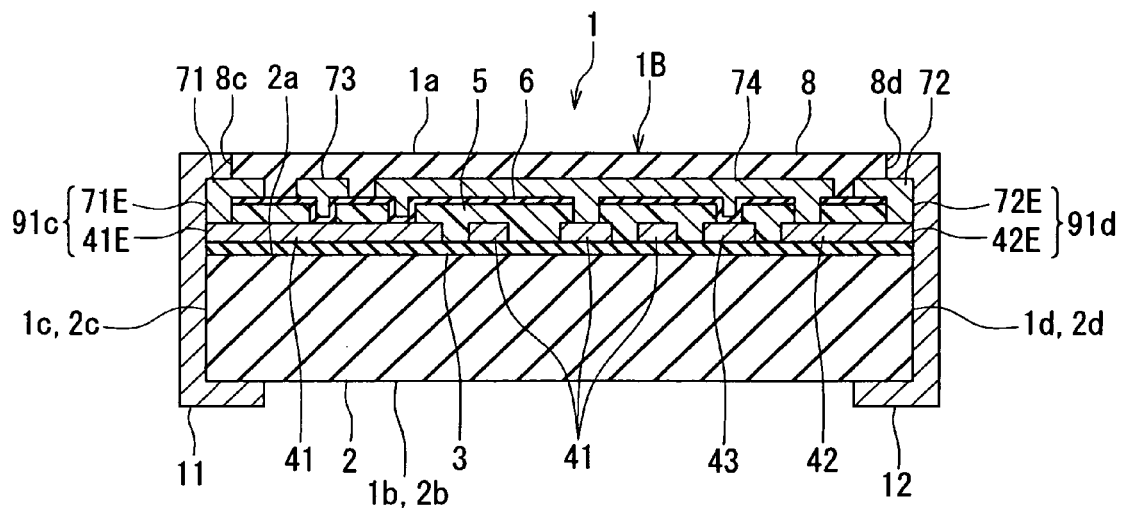
FIG. 2 is another cross-sectional view of the thin-film device of the first embodiment of the invention.
Figure 3:
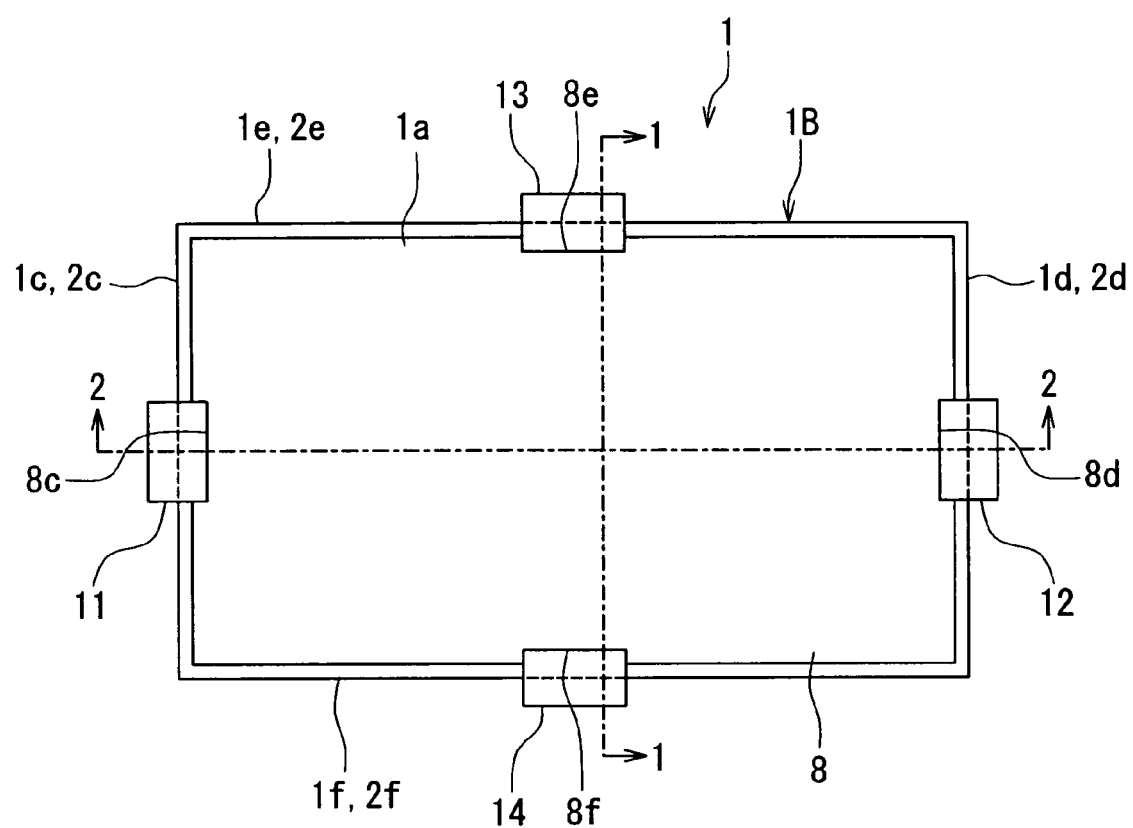
FIG. 3 is a top view of the thin-film device of the first embodiment of the invention.
Figure 4:
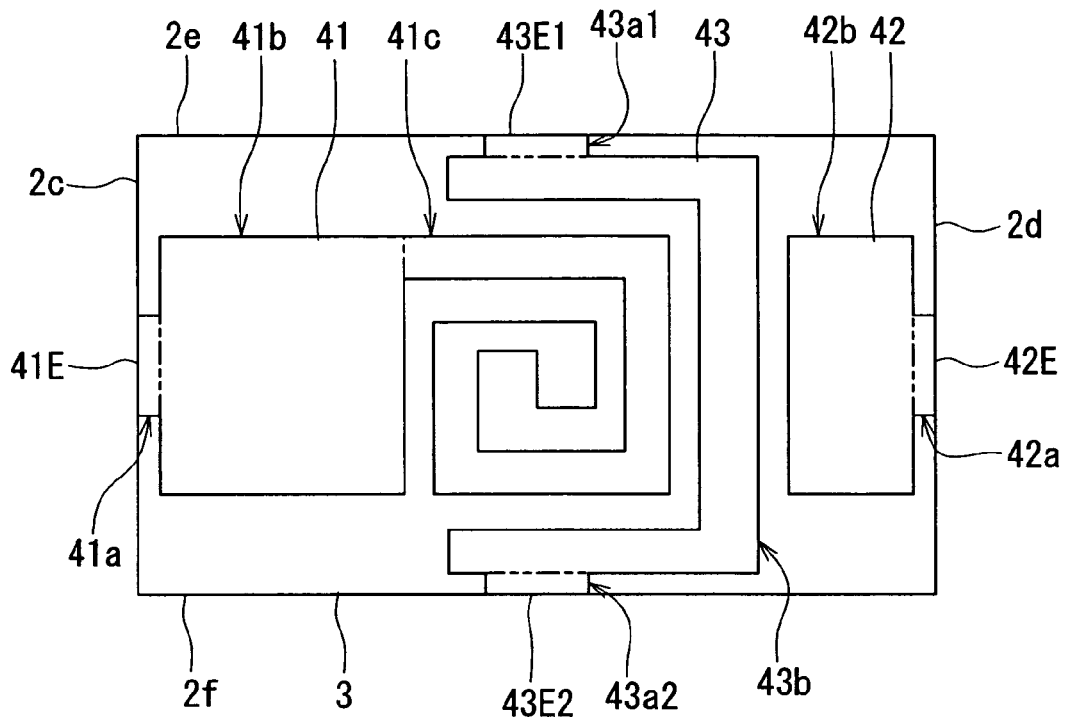
FIG. 4 is a top view of lower conductor layers that the thin-film device of the first embodiment of the invention includes.
Figure 5:
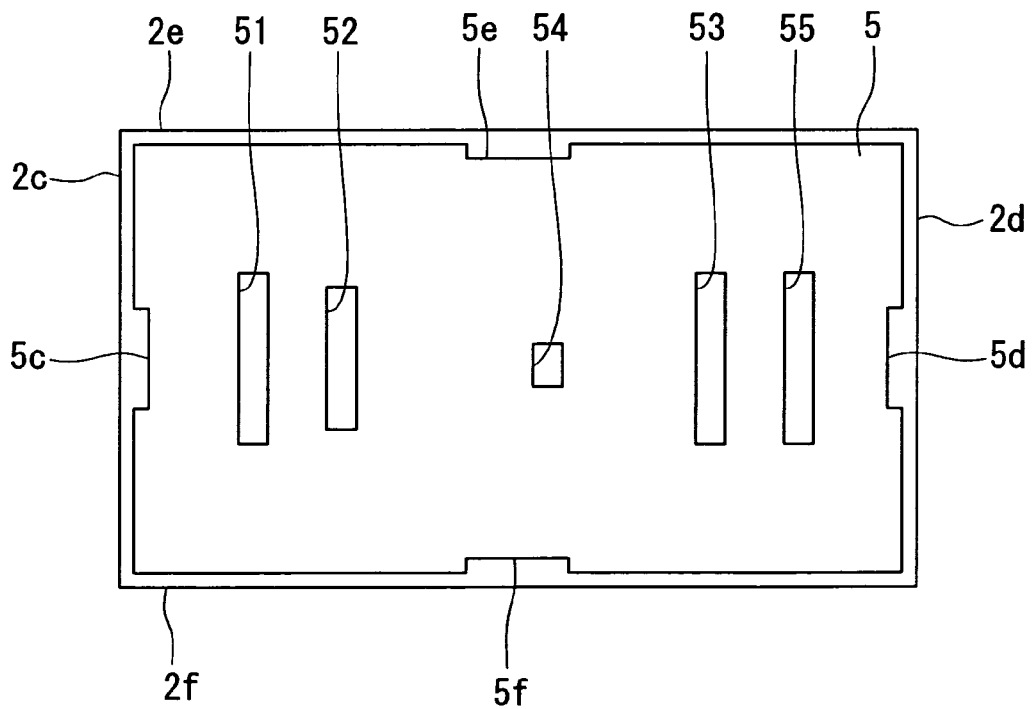
FIG. 5 is a top view of an insulating layer that the thin-film device of the first embodiment of the invention includes.
Figure 6:
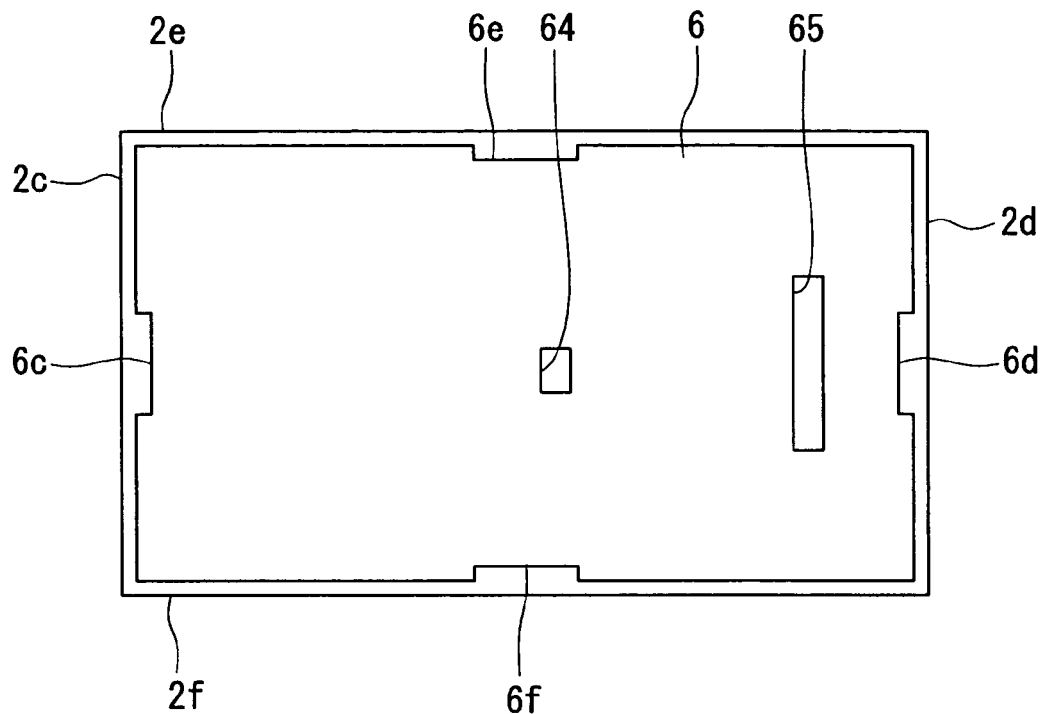
FIG. 6 is a top view of a dielectric film that the thin-film device of the first embodiment of the invention includes.
Figure 7:
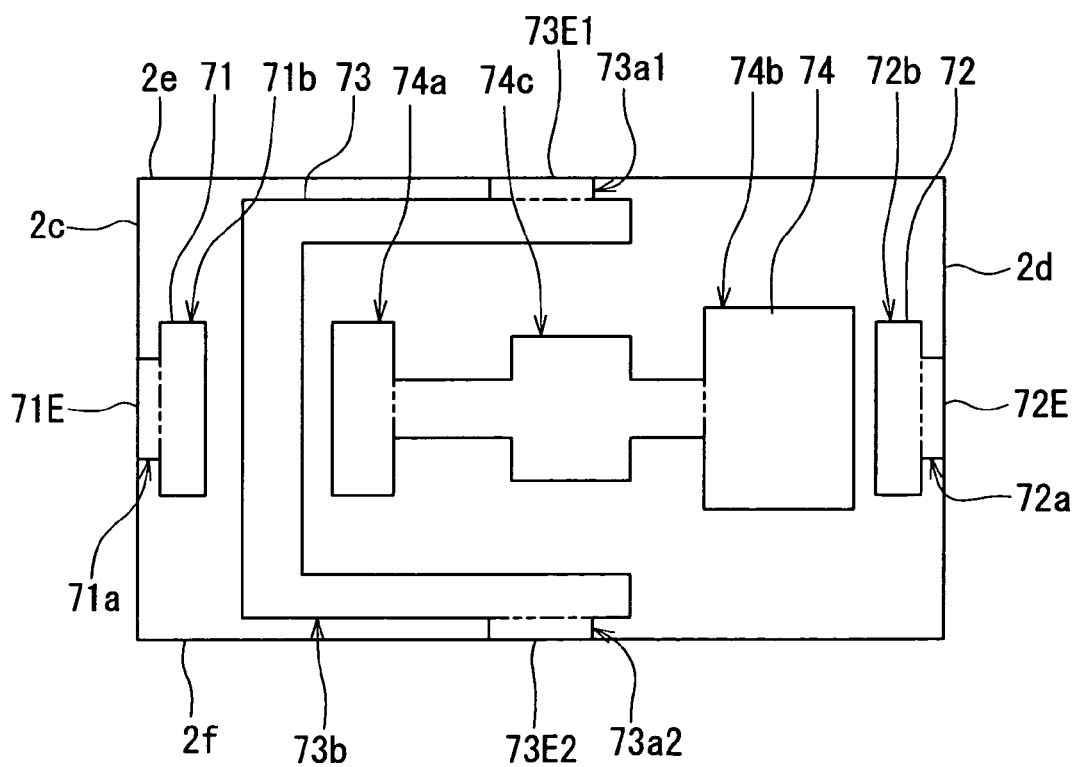
FIG. 7 is a top view of upper conductor layers that the thin-film device of the first embodiment of the invention includes.
Figure 8:
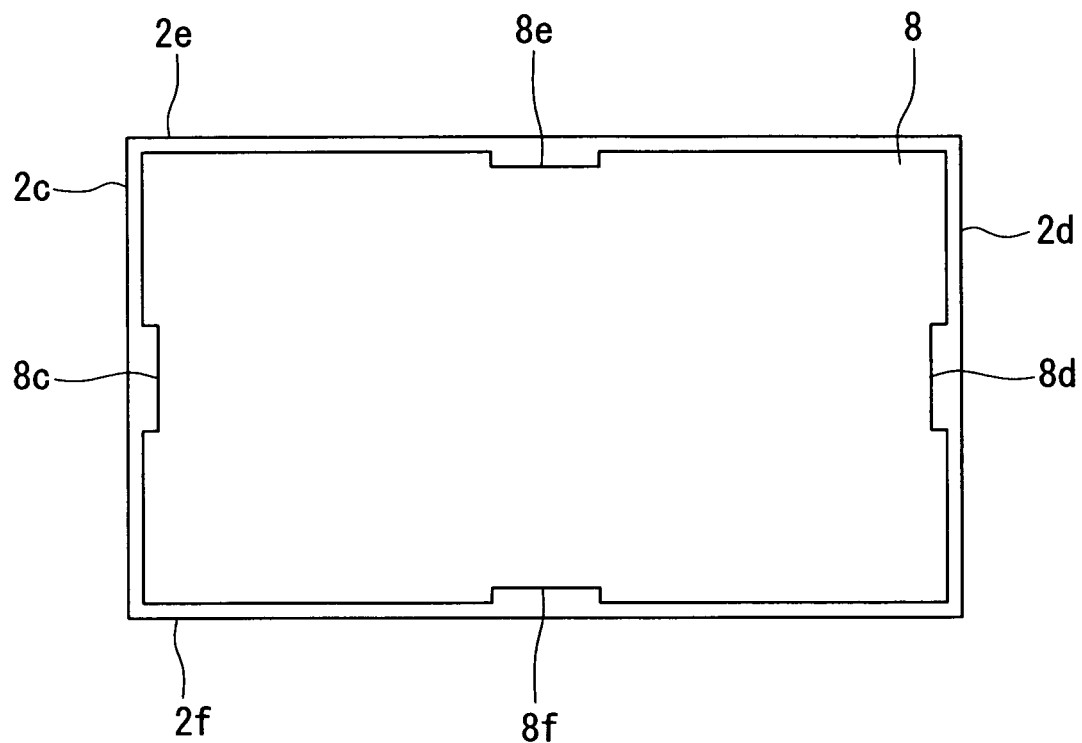
FIG. 8 is a top view of a protection film that the thin-film device of the first embodiment of the invention includes.

Reference is now made to FIG. 1 to FIG. 8 to describe the structure of the thin-film device 1 of the embodiment. Each of FIG. 1 and FIG. 2 is a cross-sectional view of the thin-film device 1. FIG. 3 is a top view of the thin-film device 1. The cross-section of FIG. 1 is taken along line 1-1 of FIG. 3. The cross-section of FIG. 2 is taken along line 2-2 of FIG. 3. FIG. 4 is a top view of lower conductor layers that the thin-film device 1 includes. FIG. 5 is a top view of an insulating layer that the thin-film device 1 includes. FIG. 6 is a top view of a dielectric film that the thin-film device 1 includes. FIG. 7 is a top view of upper conductor layers that the thin-film device 1 includes. FIG. 8 is a top view of a protection film that the thin-film device 1 includes.

As shown in FIG. 1 to FIG. 3, the thin-film device 1 incorporates a device main body 1B and four terminal electrodes 11 to 14. The device main body 1B corresponds to a layered structure of the invention. The device main body 1B is nearly rectangular-solid-shaped, and has a top surface 1a, a bottom surface 1b, and four side surfaces 1c to 1f coupling the top surface 1a and the bottom surface 1b to each other. The terminal electrodes 11 to 14 are disposed to touch respective portions of the side surfaces 1c to 1f. The terminal electrode 11 constitutes the input/output terminal 101 of FIG. 9. The terminal electrode 12 constitutes the input/output terminal 102 of FIG. 9. The terminal electrodes 13 and 14 are designed to be connected to the ground.

The device main body 1B incorporates: a substrate 2; and a flattening film 3, lower conductor layers 41 to 43, an insulating layer 5, a dielectric film 6, upper conductor layers 71 to 74, and a protection film 8 that are stacked in this order on the substrate 2.

The substrate 2 is rectangular-solid-shaped. The substrate 2 has: a top surface 2a and a bottom surface 2b that face toward opposite directions; and four side surfaces 2c to 2f that couple the top surface 2a and the bottom surface 2b to each other. The substrate 2 is made of an insulating material (a dielectric material), for example. The insulating material forming the substrate 2 may be an inorganic material or an organic material. The insulating material forming the substrate 2 may be $Al_2O_3$, for example. The substrate 2 may be made of a semiconductor material.

The flattening film 3 is made of an insulating material. The insulating material forming the flattening film 3 may be an inorganic material or an organic material. The inorganic material forming the flattening film 3 may be $Al_2O_3$, for example. The organic material forming the flattening film 3 may be a resin. In this case, the resin may be a thermoplastic resin or a thermosetting resin. The surface roughness of the top surface of the flattening film 3 is smaller than that of the top surface of the substrate 2. Therefore, the flattening film 3 has a function of reducing the surface roughness of a layer underlying the lower conductor layers 41 to 43. It is required that the flattening film 3 accommodate irregularities of the top surface of the substrate 2 and that the top surface of the flattening film 3 be flat. To achieve this, it is desirable that the flattening film 3 have a thickness within a range of 0.1 to 10 μm inclusive. If the substrate 2 is made of an insulating material and the surface roughness of the top surface thereof is sufficiently small, the lower conductor layers 41 to 43 may be disposed directly on the substrate 2 without providing the flattening film 3.

The lower conductor layers 41 to 43, the upper conductor layers 71 to 74, and the terminal electrodes 11 to 14 are made of a conductive material. Each of the lower conductor layers 41 to 43 preferably has a thickness within a range of 5 to 10 μm inclusive. Each of the upper conductor layers 71 to 74 preferably has a thickness within a range of 5 to 10 μm inclusive. Each of the terminal electrodes 11 to 14 preferably has a thickness within a range of 0.5 to 10 μm inclusive, so that breakage of the terminal electrodes 11 to 14 will not occur in corners or stepped portions.

Each of the insulating layer 5 and the protection film 8 is made of an insulating material. The insulating material forming the insulating layer 5 and the protection film 8 may be an inorganic material or an organic material. The inorganic material forming the insulating layer 5 and the protection film 8 may be Al$_2$O$_3$, for example. The organic material forming the insulating layer 5 and the protection film 8 may be a resin. In this case, the resin may be a thermoplastic resin or a thermosetting resin. The resin may be any of a polyimide resin, an acrylic resin, an epoxy resin, an ethylene tetrafluoride resin, denatured polyphenylene ether, a liquid crystal polymer, and modified polyimide, for example. The resin may be a photosensitive resin. The insulating layer 5 preferably has a thickness within a range of 0.1 to 10 μm inclusive, so as to improve the reliability of insulation between the upper and lower conductor layers and to improve the high frequency characteristic by suppressing occurrences of unwanted components such as stray capacitance. The protection film 8 preferably has a thickness within a range of 1 to 50 μm inclusive, so as to protect the inside of the product with the protection film 8.

The dielectric film 6 is made of a dielectric material. The dielectric material forming the dielectric film 6 is preferably an inorganic material. The dielectric material forming the dielectric film 6 may be Al$_2$O$_3$, Si$_4$N$_3$ or SiO$_2$, for example. The dielectric film 6 preferably has a thickness within a range of 0.02 to 1 μm inclusive, and more preferably within a range of 0.05 to 0.5 μm inclusive.

Reference is now made to FIG. 4 to describe the shapes of the lower conductor layers 41 to 43. FIG. 4 is a top view illustrating the lower conductor layers 41 to 43. The lower conductor layer 41 includes: a lead electrode portion 41a; a capacitor-forming portion 41b connected to the lead electrode portion 41a; and an inductor-forming portion 41c having an end connected to the capacitor-forming portion 41b. The lower conductor layer 41 has an end face 41E located at a position that coincides with the ridgeline between the top surface 2a and the side surface 2c of the substrate 2 when the lower conductor layer 41 is seen from above. The end face 41E is also an end face of the lead electrode portion 41a.

The lower conductor layer 42 includes a lead electrode portion 42a and a wiring portion 42b connected to the lead electrode portion 42a. The lower conductor layer 42 has an end face 42E located at a position that coincides with the ridgeline between the top surface 2a and the side surface 2d of the substrate 2 when the lower conductor layer 42 is seen from above. The end face 42E is also an end face of the lead electrode portion 42a.

The lower conductor layer 43 includes lead electrode portions 43a1 and 43a2, and a capacitor-forming portions 43b connecting the lead electrode portions 43a1 and 43a2 to each other. The lower conductor layer 43 has an end face 43E1 located at a position that coincides with the ridgeline between the top surface 2a and the side surface 2e of the substrate 2 when the lower conductor layer 43 is seen from above. The end face 43E1 is also an end face of the lead electrode portion 43a1. In addition, the lower conductor layer 43 has an end face 43E2 located at a position that coincides with the ridgeline between the top surface 2a and the side surface 2f of the substrate 2 when the lower conductor layer 43 is seen from above. The end face 43E2 is also an end face of the lead electrode portion 43a2.

Reference is now made to FIG. 5 to describe the shape of the insulating layer 5. FIG. 5 is a top view of the insulating layer 5. The illustrating layer 5 covers major parts of the flattening film 3 and the lower conductor layers 41 to 43. The insulating layer 5 has openings 51 to 55. The openings 51 and 52 are located above the capacitor-forming portion 41b of the lower conductor layer 41. The opening 53 is located above the capacitor-forming portion 43b of the lower conductor layer 43. The opening 54 is located above a portion near the other end of the inductor-forming portion 41c of the lower conductor layer 41. The opening 55 is located above the wiring portion 42b of the lower conductor layer 42.

The insulating layer 5 has four concave portions 5c to 5f each of which has a shape that is recessed inward from the outer edge of the insulating layer 5. The concave portions 5c to 5f are respectively located at positions corresponding to the side surfaces 2c to 2f of the substrate 2. The concave portions 5c to 5f expose the top surfaces of the lead electrode portions 41a, 42a, 43a1 and 43a2, respectively.

Reference is now made to FIG. 6 to describe the shape of the dielectric film 6. FIG. 6 is a top view of the dielectric film 6. The dielectric film 6 covers the entire top surface of the insulating layer 5. The dielectric film 6 is also located in the openings 51, 52 and 53. The dielectric film 6 has openings 64 and 65. The opening 64 is located above the opening 54 of the insulating layer 5. The opening 65 is located above the opening 55 of the insulating layer 5.

The dielectric film 6 has four concave portions 6c to 6f each of which has a shape that is recessed inward from the outer edge of the dielectric film 6. The concave portions 6c to 6f are respectively located above the concave portions 5c to 5f of the insulating layer 5. The concave portions 6c to 6f expose the top surfaces of the lead electrode portions 41a, 42a, 43a1 and 43a2, respectively.

Reference is now made to FIG. 7 to describe the shapes of the upper conductor layers 71 to 74. FIG. 7 is a top view illustrating the upper conductor layers 71 to 74. The upper conductor layer 71 includes a lead electrode portion 71a, and a wide portion 71b connected to the lead electrode portion 71a. The upper conductor layer 71 has an end face 71E located at a position that coincides with the ridgeline between the top surface 2a and the side surface 2c of the substrate 2 when the upper conductor layer 71 is seen from above. The end face 71E is also an end face of the lead electrode portion 71a.

The upper conductor layer 72 includes a lead electrode portion 72a and a wide portion 72b connected to the lead electrode portion 72a. The upper conductor layer 72 has an end face 72E located at a position that coincides with the ridgeline between the top surface 2a and the side surface 2d of the substrate 2 when the upper conductor layer 72 is seen from above. The end face 72E is also an end face of the lead electrode portion 72a.

The upper conductor layer 73 includes lead electrode portions 73a1 and 73a2, and a capacitor-forming portion 73b connecting the lead electrode portions 73a1 and 73a2 to each other. The upper conductor layer 73 has an end face 73E1 located at a position that coincides with the ridgeline between the top surface 2a and the side surface 2e of the substrate 2 when the upper conductor layer 73 is seen from above. The end face 73E1 is also an end face of the lead electrode portion 73a1. In addition, the upper conductor layer 73 has an end face 73E2 located at a position that coincides with the ridgeline between the top surface 2a and the side surface 2f of the substrate 2 when the upper conductor layer 73 is seen from above. The end face 73E2 is also an end face of the lead electrode portion 73a2. A portion of the capacitor-forming portion 73b is located in the opening 51 and opposed to a portion of the capacitor-forming portion 41b of the lower conductor layer 41 with the dielectric film 6 disposed in between. These portions of the capacitor-forming portions 73b and 41b and the dielectric film 6 constitute the capacitor 111 of FIG. 9.

The upper conductor layer 74 includes capacitor-forming portions 74a and 74b, and a wiring portion 74c connecting the capacitor-forming portions 74a and 74b to each other. A portion of the capacitor-forming portion 74a is located in the opening 52 and opposed to another portion of the capacitor-forming portion 41b of the lower conductor layer 41 with the dielectric film 6 disposed in between. These portions of the capacitor-forming portions 74a and 41b and the dielectric film 6 constitute the capacitor 113 of FIG. 9. A portion of the capacitor-forming portion 74b is located in the opening 53 and opposed to a portion of the capacitor-forming portion 43b of the lower conductor layer 43 with the dielectric film 6 disposed in between. These portions of the capacitor-forming portions 74b and 43b and the dielectric film 6 constitute the capacitor 112 of FIG. 9. Another portion of the capacitor-forming portion 74b is located in the openings 65 and 55 and connected to the wiring portion 42b of the lower conductor layer 42. A portion of the wiring portion 74c is located in the openings 64 and 54 and connected to the portion near the other end of the inductor-forming portion 41c of the lower conductor layer 41. The inductor-forming portion 41c constitutes the inductor 114 of FIG. 9.

The lead electrode portions 71a, 72a, 73a1 and 73a2 are connected to the lead electrode portions 41a, 42a, 43a1 and 43a2, respectively.

Reference is now made to FIG. 8 to describe the shape of the protection film 8. FIG. 8 is a top view of the protection film 8. The protection film 8 covers major parts of the upper conductor layers 71 to 74. The protection film 8 has four concave portions 8c to 8f each of which has a shape that is recessed inward from the outer edge of the protection film 8. The concave portions 8c to 8f are respectively located above the concave portions 6c to 6f of the dielectric film 6. The concave portions 8c to 8f expose the top surfaces of the lead electrode portions 71a, 72a, 73a1 and 73a2, respectively.

Reference is now made to FIG. 1 to FIG. 3 to describe the connection between the conductor layers and the terminal electrodes 11 to 14 in detail. As shown in FIG. 2, at the side surface 1c of the device main body 1B, the end face 41E of the lower conductor layer 41 and the end face 71E of the upper conductor layer 71 are electrically and physically connected to each other. As a result, the end faces 41E and 71E form one contiguous terminal connecting surface 91c. As shown in FIG. 2, at the side surface 1d of the device main body 1B, the end face 42E of the lower conductor layer 42 and the end face 72E of the upper conductor layer 72 are electrically and physically connected to each other. As a result, the end faces 42E and 72E form one contiguous terminal connecting surface 91d. As shown in FIG. 1, at the side surface 1e of the device main body 1B, the end face 43E1 of the lower conductor layer 43 and the end face 73E1 of the upper conductor layer 73 are electrically and physically connected to each other. As a result, the end faces 43E1 and 73E1 form one contiguous terminal connecting surface 91e. As shown in FIG. 1, at the side surface 1f of the device main body 1B, the end face 43E2 of the lower conductor layer 43 and the end face 73E2 of the upper conductor layer 73 are electrically and physically connected to each other. As a result, the end faces 43E2 and 73E2 form one contiguous terminal connecting surface 91f.

As shown in FIG. 2, the terminal electrode 11 is disposed to touch a portion of the side surface 1c and a portion of the bottom surface 1b contiguous to the side surface 1c of the device main body 1B. The terminal electrode 11 is smaller in width than the side surface 1c. The terminal electrode 11 touches the end faces 41E and 71E, that is, the terminal connecting surface 91c, and is thereby connected to the conductor layers 41 and 71. A portion of the terminal electrode 11 is placed in the concave portion 8c of the protection film 8 and thereby touches a portion of the top surface of the upper conductor layer 71.

As shown in FIG. 2, the terminal electrode 12 is disposed to touch a portion of the side surface 1d and a portion of the bottom surface 1b contiguous to the side surface 1d of the device main body 1B. The terminal electrode 12 is smaller in width than the side surface 1d. The terminal electrode 12 touches the end faces 42E and 72E, that is, the terminal connecting surface 91d, and is thereby connected to the conductor layers 42 and 72. A portion of the terminal electrode 12 is placed in the concave portion 8d of the protection film 8 and thereby touches a portion of the top surface of the upper conductor layer 72.

As shown in FIG. 1, the terminal electrode 13 is disposed to touch a portion of the side surface 1e and a portion of the bottom surface 1b contiguous to the side surface 1e of the device main body 1B. The terminal electrode 13 is smaller in width than the side surface 1e. The terminal electrode 13 touches the end faces 43E1 and 73E1, that is, the terminal connecting surface 91e, and is thereby connected to the conductor layers 43 and 73. A portion of the terminal electrode 13 is placed in the concave portion 8e of the protection film 8 and thereby touches a portion of the top surface of the upper conductor layer 73.

As shown in FIG. 1, the terminal electrode 14 is disposed to touch a portion of the side surface 1f and a portion of the bottom surface 1b contiguous to the side surface 1f of the device main body 1B. The terminal electrode 14 is smaller in width than the side surface 1f. The terminal electrode 14 touches the end faces 43E2 and 73E2, that is, the terminal connecting surface 91f, and is thereby connected to the conductor layers 43 and 73. A portion of the terminal electrode 14 is placed in the concave portion 8f of the protection film 8 and thereby touches a portion of the top surface of the upper conductor layer 73.

The terminal electrodes 11 to 14 do not extend out of the concave portions 8c to 8f, respectively, and do not reach over the protection film 8. In the example shown in FIG. 1 to FIG. 3, there is no space between respective edges of the concave portions 8c to 8f and the respective portions of the terminal electrodes 11 to 14 disposed in the concave portions 8c to 8f. Furthermore, in this example, the top surface of the protection film 8 and the top surfaces of the terminal electrodes 11 to 14 form a contiguous flat surface. In this case, the top surface of the thin-film device 1 is flat. It suffices that portions of the terminal electrodes 11 to 14 are disposed in the concave portions 8c to 8f, respectively, and there may be a space between the respective edges of the concave portions 8c to 8f and the respective portions of the terminal electrodes 11 to 14. Furthermore, there may be a difference in level between the top surface of the protection film 8 and the top surface of each of the terminal electrodes 11 to 14.

It is not necessarily required that the terminal electrodes 11 to 14 be located on the bottom surface 1b of the device main body 1B. Furthermore, the lower end face of each of the terminal electrodes 11 to 14 may be located at an arbitrary level between the lower surface of the lower conductor layer and the bottom surface 1b of the device main body 1B.

Figure 10:
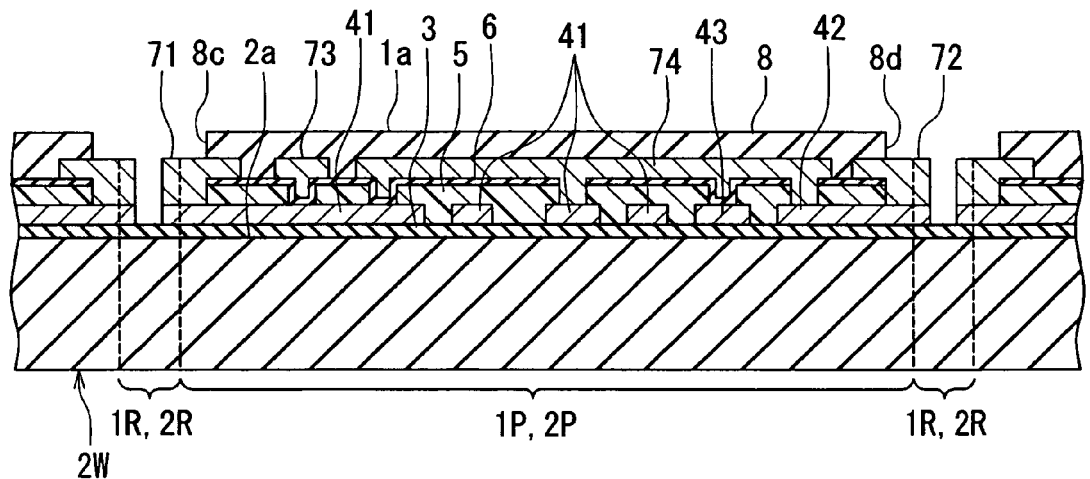
FIG. 10 is a cross-sectional view for describing a method of manufacturing the thin-film device of the first embodiment of the invention.
Figure 11:
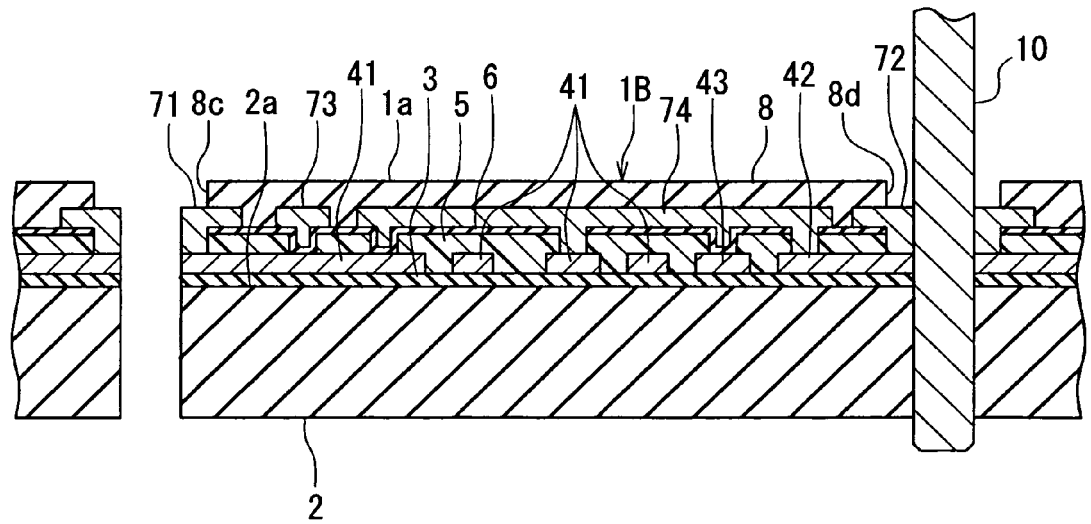
FIG. 11 is a cross-sectional view illustrating a step that follows the step of FIG. 10.

Reference is now made to FIG. 10 and FIG. 11 to describe a method of manufacturing the thin-film device 1 of the embodiment. FIG. 10 and FIG. 11 are cross-sectional views for describing the method of manufacturing the thin-film device 1. FIG. 10 and FIG. 11 show cross sections corresponding to FIG. 2. Although examples of materials and thicknesses of the layers are given in the following description, those examples are non-limiting for the method of the embodiment.

In the method of manufacturing the thin-film device 1 of the embodiment, first, a wafer 2W of FIG. 10 is prepared. The wafer 2W includes: pre-substrate portions 2P arranged in a plurality of rows; and portions to be removed 2R provided between respective adjacent ones of the pre-substrate portions 2P. The pre-substrate portions 2P are portions each of which will be the substrate 2 later. The portions to be removed 2R are portions that will be removed later by cutting the wafer 2W.

Next, the flattening film 3 is formed on the wafer 2W. Next, the top surface of the flattening film 3 is flattened by polishing. A method employed for this polishing may be chemical mechanical polishing (CMP), for example. The polishing is performed so that the thickness of the flattening film 3 polished is 2 µm, for example. It is not necessary to flatten the top surface of the flattening film 3 by polishing if the surface roughness of the top surface of the flattening film 3 is small enough without flattening the top surface of the flattening film 3.

Next, the lower conductor layers 41 to 43 are formed on the flattening film 3. At this time, the lead electrode portions 41a, 42a, 43a1 and 43a2 are formed to extend over regions above the portions to be removed 2R, so that the respective end faces to be connected to the terminal electrodes 11 to 14 will be formed when the wafer 2W is cut later. Every two of the lower conductor layers adjacent to each other across a region above the portions to be removed 2R may be coupled to each other in the region above the portions to be removed 2R.

The lower conductor layers 41 to 43 are formed in the following manner, for example. First, an electrode film is formed on the flattening film 3 by sputtering, for example. The electrode film will be used as an electrode when a plating film is formed later by electroplating, and will form portions of the lower conductor layers 41 to 43. The electrode film may be a layered film made up of a Ti film having a thickness of 30 nm and a Cu film having a thickness of 100 nm, for example. Next, a photoresist layer having a thickness of 8 µm, for example, is formed on the electrode film. Next, the photoresist layer is patterned by photolithography to form a frame. The frame has grooves having shapes corresponding to the lower conductor layers 41 to 43 to be formed. Next, the plating film is formed in the grooves of the frame by electroplating. The plating film is made of Cu, for example, and has a thickness of 9 to 10 µm, for example. Next, the top surface of the plating film is flattened by polishing. A method employed for this polishing is CMP, for example. The polishing is performed so that the thickness of the plating film polished is 8 µm, for example. Next, the frame is removed. Next, the electrode film except a portion below the plating film is removed by dry etching or wet etching. The lower conductor layers 41 to 43 are thereby formed of the remaining portions of the electrode film and the plating film.

Instead of employing such a process, the lower conductor layers 41 to 43 may be formed by forming an unpatterned plating film on the entire top surface of the electrode film and then etching portions of this plating film and the electrode film. Alternatively, the lower conductor layers 41 to 43 may be formed by forming an unpatterned conductor film on the flattening film 3 by physical vapor deposition such as sputtering or evaporation and then etching a portion of the conductor film.

Next, the insulating layer 5 is formed by sputtering, for example, to cover the flattening film 3 and the lower conductor layers 41 to 43. The insulating layer 5 has the openings 51 to 55 and the concave portions 5c to 5f. If a photosensitive resin is used as the material of the insulating layer 5, the insulating layer 5 is patterned by photolithography. If a material other than a photosensitive resin is used as the material of the insulating layer 5, the insulating layer 5 is patterned by selective etching, for example.

Next, the dielectric film 6 is formed on the insulating layer 5. The thickness of the dielectric film 6 is 0.1 µm, for example. Next, a photoresist layer is formed on the dielectric film 6. The photoresist layer is then patterned by photolithography to form a mask for forming the openings 64 and 65 and the concave portions 6c to 6f of the dielectric film 6. The mask covers portions of the dielectric film 6 to be left finally. Next, portions of the dielectric film 6 that are not covered with the mask are removed by ashing or etching. The openings 64 and 65 and the concave portions 6c to 6f are thereby formed in the dielectric film 6. Next, the photoresist layer is removed.

Next, the upper conductor layers 71 to 74 are formed on the dielectric film 6. At this time, the lead electrode portions 71a, 72a, 73a1 and 73a2 are formed to extend over regions above the portions to be removed 2R, so that the respective end faces to be connected to the terminal electrodes 11 to 14 will be formed when the wafer 2W is cut later. Every two of the upper conductor layers adjacent to each other across a region above the portions to be removed 2R may be coupled to each other in the region above the portions to be removed 2R. The method of forming the upper conductor layers 71 to 74 is the same as that of the lower conductor layers 41 to 43.

Next, the protection film 8 is formed to cover the upper conductor layers 71 to 74. At this point, the concave portions 8c to 8f are not formed in the protection film 8 yet.

Next, the protection film 8 is processed so as to remove portions of the protection film 8 located in the respective regions above the portions to be removed 2R and remove portions of the protection film 8 corresponding to the concave portions 8c to 8f to be formed. The concave portions 8c to 8f are thereby formed in the protection film 8. The protection film 8 may be processed by laser processing, etching using plasma, or processing using a dicing saw, for example. If a photosensitive resin is used as the material of the protection film 8, the protection film 8 may be processed by photolithography. Here, the layered structure made up of the layers from the wafer 2W to the protection film 8 fabricated through the foregoing steps is called a thin-film device substructure. The substructure includes: a plurality of preliminary device main body portions 1P each of which will be the device main body 1B; and portions to be removed 1R disposed between respective adjacent ones of the preliminary device main body portions 1P. The preliminary device main body portions 1P are made up of the pre-substrate portions 2P and portions thereabove of the substructure. The portions to be removed 1R are made up of the portions to be removed 2R and portions thereabove of the substructure.

Next, as shown in FIG. 11, the substructure is cut with a dicing saw, for example, at the locations of the portions to be removed 1R. As a result, the portions 1R of the substructure are removed, and the plurality of preliminary device main body portions 1P are separated. Each of the preliminary device main body portions 1P separated become the device main body 1B. By cutting the substructure, there are formed the terminal connecting surfaces 91c to 91f. In FIG. 11 numeral 10 indicates the blade of the dicing saw.

Next, as shown in FIG. 2, the terminal electrodes 11 to 14 are formed at specific locations of the device main body 1B. The terminal electrodes 11 to 14 are formed in the following manner, for example. First, a base electrode film is formed at a specific location of the device main body 1B. The base electrode film may be formed by applying a conductive resin or a conductive paste to the specific location of the device main body 1B by screen printing or transfer and then drying and hardening the resin or paste. Alternatively, a base electrode film made of a conductive film may be formed by forming a mask having an opening at a specific location on the device main body 1B, forming a conductive film by sputtering, for example, on the mask and in the opening, and then removing the mask. The conductive film used in this case may be a layered film made up of a Cr film and a Cu film, a layered film made up of a Ti film and a Cu film, or a layered film made up of an Ni film and a Cu film, for example. Next, a plating film is formed on the base electrode film by barrel plating, for example. The plating film may be a layered film made up of a first film of Ni or Ti and a second film of Sn or Au, or a layered film made up of a first film of Cu, a second film of Ni or Ti, and a third film of Sn or Au, for example.

The method of forming the terminal electrodes 11 to 14 is not limited to the above-described method. For example, the terminal electrodes 11 to 14 may be formed by applying a conductive resin or a conductive paste to the specific locations of the device main body 1B by screen printing or transfer and then drying and hardening the resin or paste.

Effects of the thin-film device 1 of the embodiment will now be described. The thin-film device 1 of the embodiment incorporates the device main body 1B and the terminal electrodes 11 to 14. The device main body 1B has the side surfaces 1c to 1f, and includes: the lower conductor layers 41 to 43 and the upper conductor layers 71 to 74, the lower and upper conductor layers being located at different levels along the direction in which the layers are stacked; and the insulating layer 5 disposed between two of the conductor layers that are adjacent to each other along the direction in which the layers are stacked. The terminal electrodes 11 to 14 are disposed to touch the side surfaces 1c to 1f, respectively. The device main body 1B incorporates the capacitors 111, 112 and 113 and the inductor 114 each of which is a passive element formed using at least one of the conductor layers.

The lower conductor layer 43 used to form the capacitor 112 has the end face 43E1 located at the side surface 1e, and the end face 43E2 located at the side surface 1f. The upper conductor layer 73 used to form the capacitor 111 and located at a level different from the level at which the lower conductor layer 43 is located along the direction in which the layers are stacked has the end face 73E1 located at the side surface 1e, and the end face 73E2 located at the side surface 1f. At the side surface 1e, the end faces 43E1 and 73E1 are electrically and physically connected to each other. As a result, the end faces 43E1 and 73E1 form the one contiguous terminal connecting surface 91e. The terminal electrode 13 touches the end faces 43E1 and 73E1, that is, the terminal connecting surface 91e, and is thereby connected to the conductor layers 43 and 73. At the side surface 1f, the end faces 43E2 and 73E2 are electrically and physically connected to each other. As a result, the end faces 43E2 and 73E2 form the one contiguous terminal connecting surface 91f. The terminal electrode 14 touches the end faces 43E2 and 73E2, that is, the terminal connecting surface 91f, and is thereby connected to the conductor layers 43 and 73. The capacitor 112 corresponds to the first passive element of the invention. The capacitor 111 corresponds to the second passive element of the invention. The lower conductor layer 43 corresponds to the first conductor layer of the invention. The upper conductor layer 73 corresponds to the second conductor layer of the invention.

The lower conductor layer 41 used to form the capacitors 111 and 113 and the inductor 114 has the end face 41E located at the side surface 1c. The upper conductor layer 71 that is not used to form any passive element and that is located at a level different from the level at which the lower conductor layer 41 is located along the direction in which the layers are stacked has the end face 71E located at the side surface 1c. At the side surface 1c, the end faces 41E and 71E are electrically and physically connected to each other. As a result, the end faces 41E and 71E form the one contiguous terminal connecting surface 91c. The terminal electrode 11 touches the end faces 41E and 71E, that is, the terminal connecting surface 91c, and is thereby connected to the conductor layers 41 and 71. The lower conductor layer 41 corresponds to the first conductor layer of the invention. The upper conductor layer 71 corresponds to the second conductor layer of the invention.

The lower conductor layer 42 that is not used to form any passive element has the end face 42E located at the side surface 1d. The upper conductor layer 72 that is not used to form any passive element and that is located at a level different from the level at which the lower conductor layer 42 is located along the direction in which the layers are stacked has the end face 72E located at the side surface 1d. At the side surface 1d, the end faces 42E and 72E are electrically and physically connected to each other. As a result, the end faces 42E and 72E form the one contiguous terminal connecting surface 91d. The terminal electrode 12 touches the end faces 42E and 72E, that is, the terminal connecting surface 91d, and is thereby connected to the conductor layers 42 and 72.

According to the embodiment, it is possible to increase the area of each of the regions in which the conductor layers touch the terminal electrodes 11 to 14, and to thereby enhance the reliability of connection between the conductor layers and the terminal electrodes 11 to 14. According to the embodiment, the respective two of the conductor layers used to form the terminal connecting surfaces 91c to 91f are not those used to form an identical passive element. As a result, to form the terminal connecting surfaces 91c to 91f, it is not necessary to make the number of conductor layers used to form a single passive element greater than required, and consequently, it is possible to reduce the size and profile of the thin-film device 1.

According to the embodiment, the maximum number of the conductor layers aligned along the direction in which the layers are stacked is two, which is the minimum number required to form the terminal connecting surfaces 91c to 91f. As a result, it is possible to reduce the size and profile of the thin-film device 1 in particular.

In the embodiment the protection film 8 has the four concave portions 8c to 8f each of which has a shape that is recessed inward from the outer edge of the protection film 8. The concave portions 8c to 8f expose the respective portions of the top surface of the upper conductor layer that touch the terminal electrodes 11 to 14, and accommodate respective portions of the terminal electrodes 11 to 14. Therefore, the concave portions 8c to 8f have a function of defining the shapes and locations of the terminal electrodes 11 to 14. As a result, according to the embodiment, it is possible to suppress variations in shapes and locations of the terminal electrodes 11 to 14. It is thereby possible to prevent variations in electrical characteristics of the thin-film device 1 resulting from variations in magnitude of electromagnetic coupling or capacitive coupling between the terminal electrodes 11 to 14 and the conductor layers of the device main body 1B. Furthermore, according to the embodiment, it is possible to prevent variations in electrical characteristics of the thin-film device 1 or an occurrence of short-circuit between adjacent ones of the terminal electrodes resulting from variations in distance between the respective adjacent ones of the terminal electrodes.

At each of the side surfaces 1c to 1f of the device main body 1B, if the end faces of the lower conductor layer and the upper conductor layer were not disposed to be contiguous to each other, the end face of the insulating layer 5 would exist between the end faces of the lower conductor layer and the upper conductor layer. Compared with this case, in the embodiment, the number of interfaces of the layers or films appearing at the side surfaces 1c to 1f is smaller, since the end faces of the lower conductor layer and the upper conductor layer are contiguous to each other. As a result, according to the embodiment, it is possible to reduce occurrences of defects such as peeling or chipping of layers or films when the thin-film device substructure is cut.

[Second Embodiment]

Figure 20:
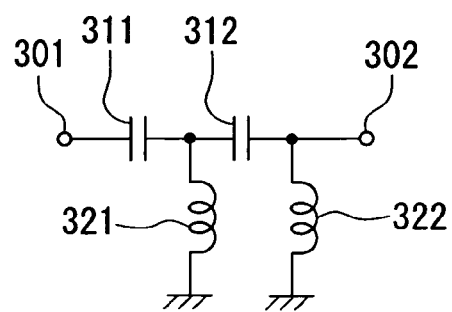
FIG. 20 is a schematic diagram illustrating the circuit configuration of the thin-film device of the second embodiment of the invention.

A thin-film device of a second embodiment of the invention will now be described. Reference is now made to FIG. 20 to describe the circuit configuration of the thin-film device of the second embodiment. FIG. 20 is a schematic diagram illustrating the circuit configuration of the thin-film device of the second embodiment. The thin-film device 201 of the embodiment has a function of a high-pass filter.

As shown in FIG. 20, the thin-film device 201 of the embodiment incorporates: two input/output terminals 301 and 302 for receiving and outputting signals; two capacitors 311 and 312; and two inductors 321 and 322. The capacitor 311 has an end connected to the input/output terminal 301. The capacitor 312 has an end connected to the other end of the capacitor 311, and has the other end connected to the input/output terminal 302. The inductor 321 has an end connected to the other end of the capacitor 311, and has the other end grounded. The inductor 322 has an end connected to the input/output terminal 302, and has the other end grounded.

Figure 12:
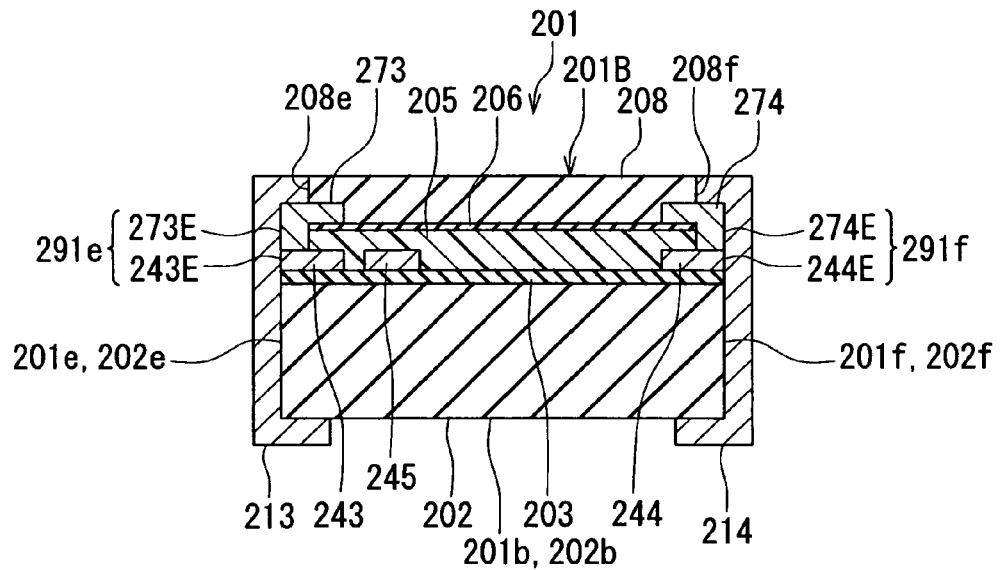
FIG. 12 is a cross-sectional view of a thin-film device of a second embodiment of the invention.
Figure 13:
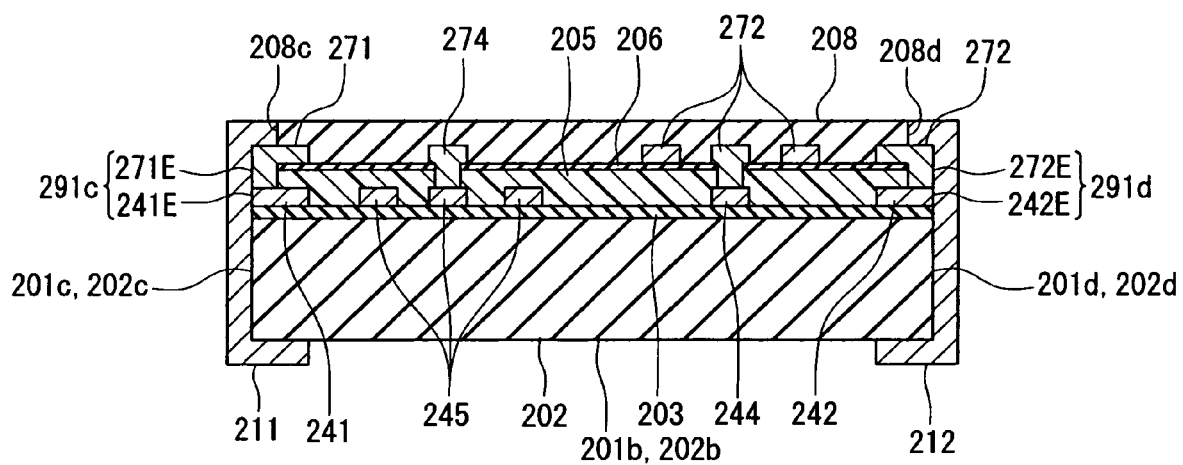
FIG. 13 is another cross-sectional view of the thin-film device of the second embodiment of the invention.
Figure 14:
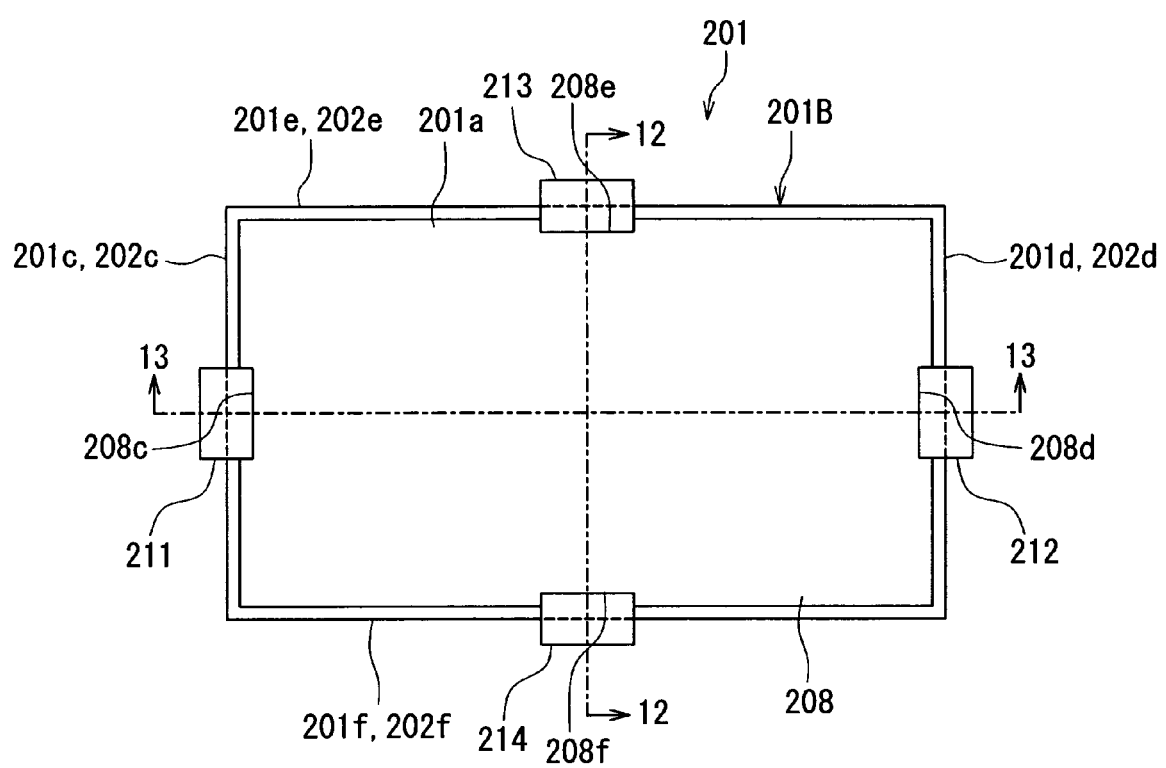
FIG. 14 is a top view of the thin-film device of the second embodiment of the invention.
Figure 15:
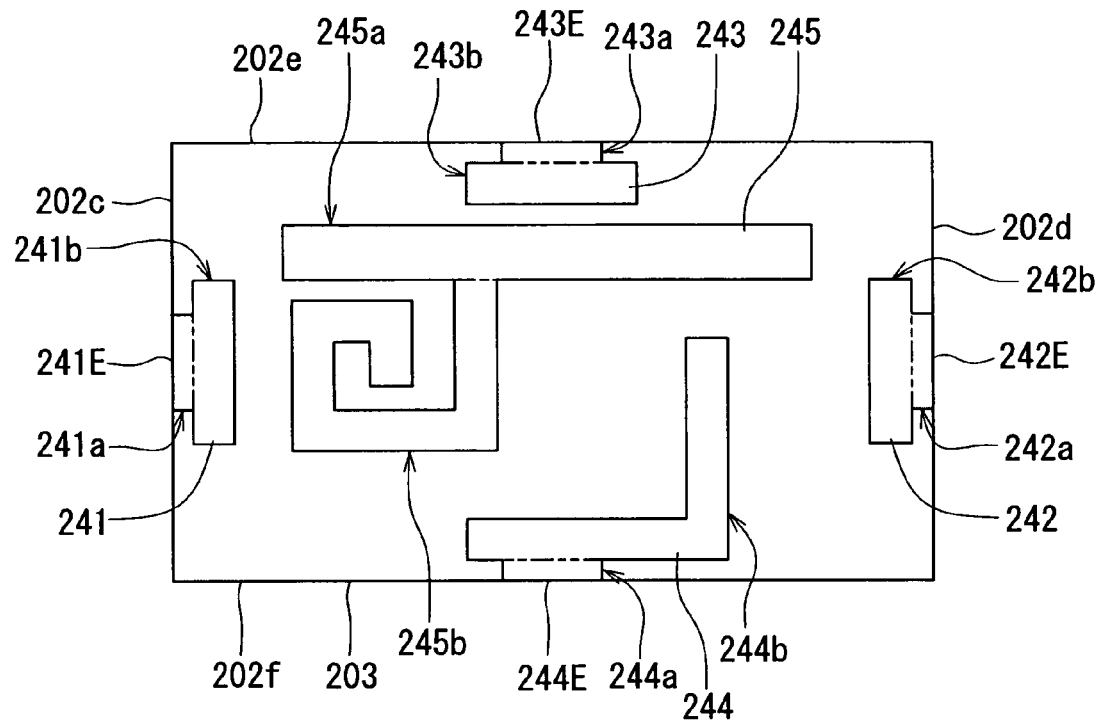
FIG. 15 is a top view of lower conductor layers that the thin-film device of the second embodiment of the invention includes.
Figure 16:
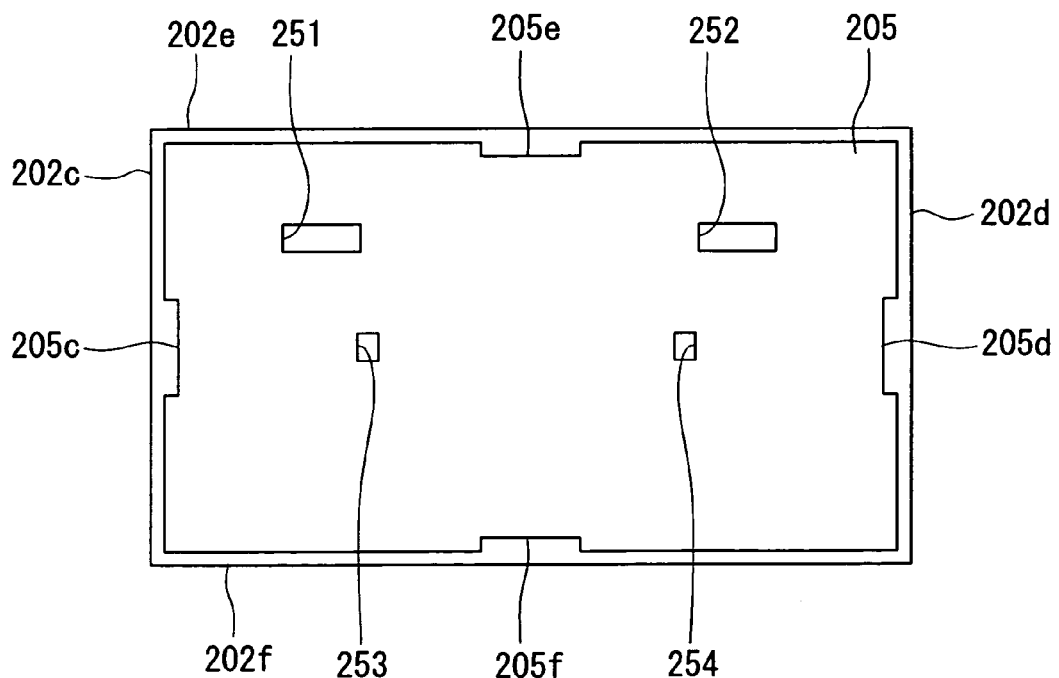
FIG. 16 is a top view of an insulating layer that the thin-film device of the second embodiment of the invention includes.
Figure 17:
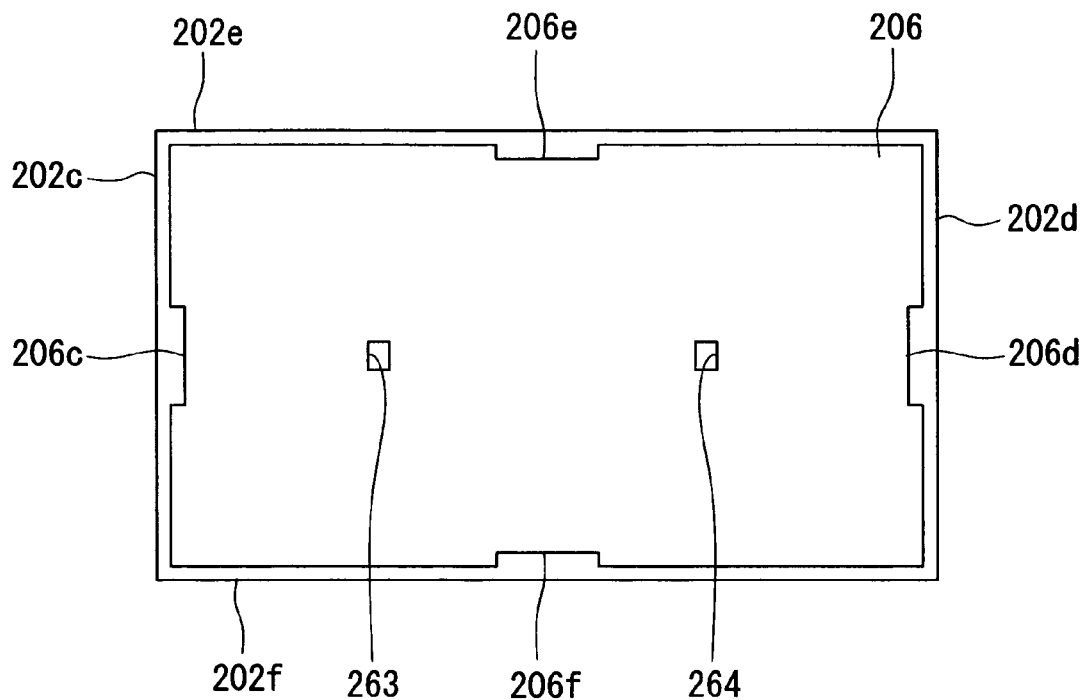
FIG. 17 is a top view of a dielectric film that the thin-film device of the second embodiment of the invention includes.
Figure 18:
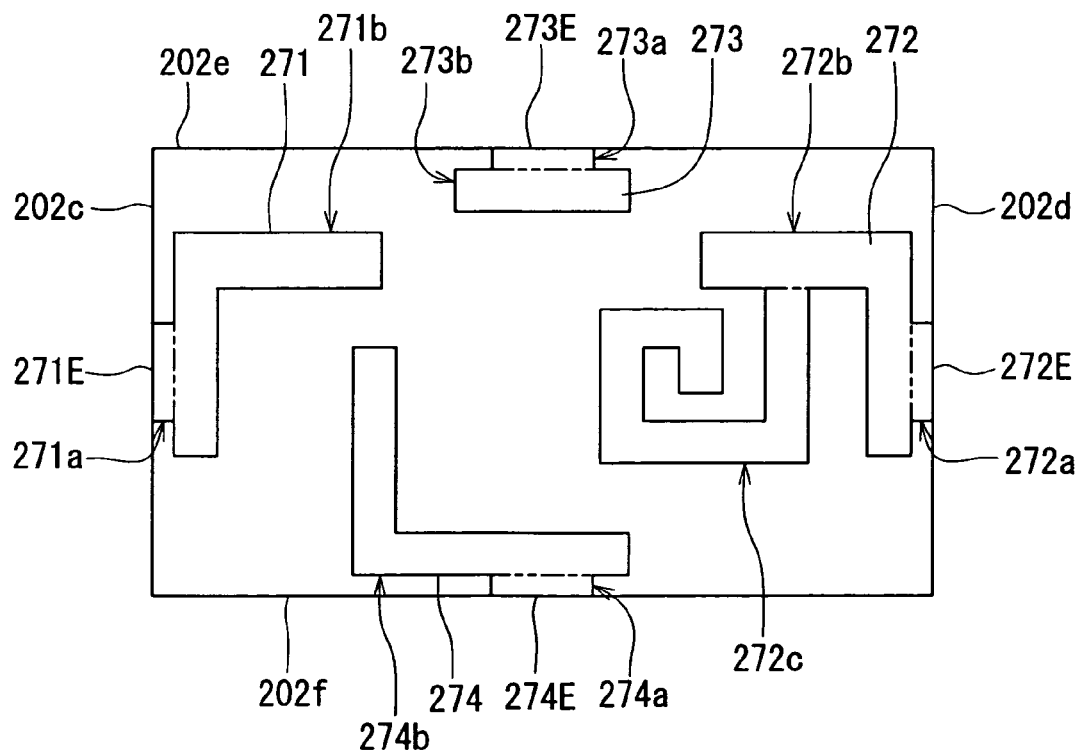
FIG. 18 is a top view of upper conductor layers that the thin-film device of the second embodiment of the invention includes.
Figure 19:
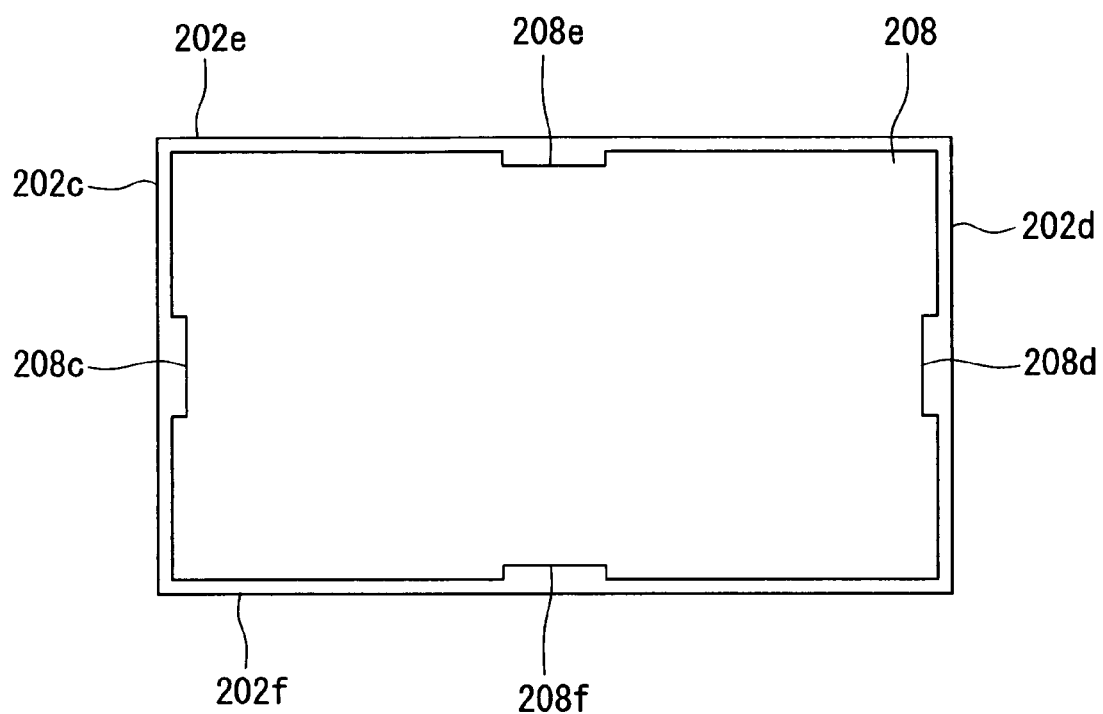
FIG. 19 is a top view of a protection film that the thin-film device of the second embodiment of the invention includes.

Reference is now made to FIG. 12 to FIG. 19 to describe the structure of the thin-film device 201 of the embodiment. Each of FIG. 12 and FIG. 13 is a cross-sectional view of the thin-film device 201. FIG. 14 is a top view of the thin-film device 201. The cross-section of FIG. 12 is taken along line 12-12 of FIG. 14. The cross-section of FIG. 13 is taken along line 13-13 of FIG. 14. FIG. 15 is a top view of lower conductor layers that the thin-film device 201 includes. FIG. 16 is a top view of an insulating layer that the thin-film device 201 includes. FIG. 17 is a top view of a dielectric film that the thin-film device 201 includes. FIG. 18 is a top view of upper conductor layers that the thin-film device 201 includes. FIG. 19 is a top view of a protection film that the thin-film device 201 includes.

As shown in FIG. 12 to FIG. 14, the thin-film device 201 incorporates a device main body 201B and four terminal electrodes 211 to 214. The device main body 201B corresponds to the layered structure of the invention. The device main body 201B is nearly rectangular-solid-shaped, and has a top surface 201a, a bottom surface 201b, and four side surfaces 201c to 201f coupling the top surface 201a and the bottom surface 201b to each other. The terminal electrodes 211 to 214 are disposed to touch respective portions of the side surfaces 201c to 201f. The terminal electrode 211 constitutes the input/output terminal 301 of FIG. 20. The terminal electrode 212 constitutes the input/output terminal 302 of FIG. 20. The terminal electrodes 213 and 214 are designed to be connected to the ground.

The device main body 201B incorporates: a substrate 202; and a flattening film 203, lower conductor layers 241 to 245, an insulating layer 205, a dielectric film 206, upper conductor layers 271 to 274, and a protection film 208 that are stacked in this order on the substrate 202.

The substrate 202 is rectangular-solid-shaped. The substrate 202 has: a top surface 202a and a bottom surface 202b that face toward opposite directions; and four side surfaces 202c to 202f that couple the top surface 202a and the bottom surface 202b to each other. The substrate 202 is made of a material the same as that of the substrate 2 of the first embodiment.

The material, thickness and surface roughness of the top surface of the flattening film 203 are the same as those of the flattening film 3 of the first embodiment. If the substrate 202 is made of an insulating material and the surface roughness of the top surface thereof is sufficiently small, the lower conductor layers 241 to 245 may be disposed directly on the substrate 202 without providing the flattening film 203.

The material and thickness of the lower conductor layers 241 to 245, the upper conductor layers 271 to 274, and the terminal electrodes 211 to 214 are the same as those of the lower conductor layers 41 to 43, the upper conductor layers 71 to 74, and the terminal electrodes 11 to 14, respectively, of the first embodiment. The material and thickness of the insulating layer 205 and the protection film 208 are the same as those of the insulating layer 5 and the protection film 8, respectively, of the first embodiment. The material and thickness of the dielectric film 206 are the same as those of the dielectric film 6 of the first embodiment.

Reference is now made to FIG. 15 to describe the shapes of the lower conductor layers 241 to 245. FIG. 15 is a top view illustrating the lower conductor layers 241 to 245. The lower conductor layer 241 includes a lead electrode portion 241a and a wide portion 241b connected to the lead electrode portion 241a. The lower conductor layer 241 has an end face 241E located at a position that coincides with the ridgeline between the top surface 202a and the side surface 202c of the substrate 202 when the lower conductor layer 241 is seen from above. The end face 241E is also an end face of the lead electrode portion 241a.

The lower conductor layer 242 includes a lead electrode portion 242a and a wide portion 242b connected to the lead electrode portion 242a. The lower conductor layer 242 has an end face 242E located at a position that coincides with the ridgeline between the top surface 202a and the side surface 202d of the substrate 202 when the lower conductor layer 242 is seen from above. The end face 242E is also an end face of the lead electrode portion 242a.

The lower conductor layer 243 includes a lead electrode portion 243a and a wide portion 243b connected to the lead electrode portion 243a. The lower conductor layer 243 has an end face 243E located at a position that coincides with the ridgeline between the top surface 202a and the side surface 202e of the substrate 202 when the lower conductor layer 243 is seen from above. The end face 243E is also an end face of the lead electrode portion 243a.

The lower conductor layer 244 includes a lead electrode portion 244a and an inductor-forming portion 244b having an end connected to the lead electrode portion 244a. The lower conductor layer 244 has an end face 244E located at a position that coincides with the ridgeline between the top surface 202a and the side surface 202f of the substrate 202 when the lower conductor layer 244 is seen from above. The end face 244E is also an end face of the lead electrode portion 244a.

The lower conductor layer 245 includes a capacitor-forming portion 245a and an inductor-forming portion 245b having an end connected to the capacitor-forming 245a.

Reference is now made to FIG. 16 to describe the shape of the insulating layer 205. FIG. 16 is a top view of the insulating layer 205. The illustrating layer 205 covers major parts of the flattening film 203 and the lower conductor layers 241 to 245. The insulating layer 205 has openings 251 to 254. The opening 251 is located above a portion near an end of the capacitor-forming portion 245a of the lower conductor layer 245, the end being taken along the longitudinal direction. The opening 252 is located above a portion near the other end of the capacitor-forming portion 245a of the lower conductor layer 245, the other end being taken along the longitudinal direction. The opening 253 is located above a portion near the other end of the inductor-forming portion 245b of the lower conductor layer 245. The opening 254 is located above a portion near the other end of the inductor-forming portion 244b of the lower conductor layer 244.

The insulating layer 205 has four concave portions 205c to 205f each of which has a shape that is recessed inward from the outer edge of the insulating layer 205. The concave portions 205c to 205f are respectively located at positions corresponding to the side surfaces 202c to 202f of the substrate 2. The concave portions 205c to 205f expose the top surfaces of the lead electrode portions 241a, 242a, 243a and 244a, respectively.

Reference is now made to FIG. 17 to describe the shape of the dielectric film 206. FIG. 17 is a top view of the dielectric film 206. The dielectric film 206 covers the entire top surface of the insulating layer 205. The dielectric film 206 is located in the openings 251 and 252, too. The dielectric film 206 has openings 263 and 264. The opening 263 is located above the opening 253 of the insulating layer 205. The opening 264 is located above the opening 254 of the insulating layer 205.

The dielectric film 206 has four concave portions 206c to 206f each of which has a shape that is recessed inward from the outer edge of the dielectric film 206. The concave portions 206c to 206f are respectively located above the concave portions 205c to 205f of the insulating layer 205. The concave portions 206c to 206f expose the top surfaces of the lead electrode portions 241a, 242a, 243a and 244a, respectively.

Reference is now made to FIG. 18 to describe the shapes of the upper conductor layers 271 to 274. FIG. 18 is a top view illustrating the upper conductor layers 271 to 274. The upper conductor layer 271 includes a lead electrode portion 271a, and a capacitor-forming portion 271b connected to the lead electrode portion 271a. The upper conductor layer 271 has an end face 271E located at a position that coincides with the ridgeline between the top surface 202a and the side surface 202c of the substrate 202 when the upper conductor layer 271 is seen from above. The end face 271E is also an end face of the lead electrode portion 271a. A portion of the capacitor-forming portion 271b is located in the opening 251 and opposed to a portion of the capacitor-forming portion 245b of the lower conductor layer 245 with the dielectric film 206 disposed in between. These portions of the capacitor-forming portions 271b and 245b and the dielectric film 206 constitute the capacitor 311 of FIG. 20.

The upper conductor layer 272 includes a lead electrode portion 272a, a capacitor-forming portion 272b connected to the lead electrode portion 272a, and an inductor-forming portion 272c having an end connected to the capacitor-forming portion 272b. The upper conductor layer 272 has an end face 272E located at a position that coincides with the ridgeline between the top surface 202a and the side surface 202d of the substrate 202 when the upper conductor layer 272 is seen from above. The end face 272E is also an end face of the lead electrode portion 272a. A portion of the capacitor-forming portion 272b is disposed in the opening 252 and opposed to another portion of the capacitor-forming portion 245b of the lower conductor layer 245 with the dielectric film 206 disposed in between. These portions of the capacitor-forming portions 272b and 245b and the dielectric film 206 constitute the capacitor 312 of FIG. 20. A portion near the other end of the inductor-forming portion 272c is located in the openings 264 and 254 and connected to the portion near the other end of the inductor-forming portion 244b of the lower conductor layer 244. The inductor-forming portions 244b and 272c constitute the inductor 322 of FIG. 20.

The upper conductor layer 273 includes a lead electrode portion 273a and a wide portion 273b connected to the lead electrode portion 273a. The upper conductor layer 273 has an end face 273E located at a position that coincides with the ridgeline between the top surface 202a and the side surface 202e of the substrate 202 when the upper conductor layer 273 is seen from above. The end face 273E is also an end face of the lead electrode portion 273a.

The upper conductor layer 274 includes a lead electrode portion 274a and an inductor-forming portion 274b having an end connected to the lead electrode portion 274a. The upper conductor layer 274 has an end face 274E located at a position that coincides with the ridgeline between the top surface 202a and the side surface 202f of the substrate 202 when the upper conductor layer 274 is seen from above. The end face 274E is also an end face of the lead electrode portion 274a. A portion near the other end of the inductor-forming portion 274b is located in the openings 263 and 253 and connected to the portion near the other end of the inductor-forming portion 245b of the lower conductor layer 245. The inductor-forming portions 245b and 274b constitute the inductor 321 of FIG. 20.

The lead electrode portions 271a, 272a, 273a and 274a are connected to the lead electrode portions 241a, 242a, 243a and 244a, respectively.

Reference is now made to FIG. 19 to describe the shape of the protection film 208. FIG. 19 is a top view of the protection film 208. The protection film 208 covers major parts of the upper conductor layers 271 to 274. The protection film 208 has four concave portions 208c to 208f each of which has a shape that is recessed inward from the outer edge of the protection film 208. The concave portions 208c to 208f are respectively located above the concave portions 206c to 206f of the dielectric film 206. The concave portions 208c to 208f expose the top surfaces of the lead electrode portions 271a, 272a, 273a and 274a, respectively.

Reference is now made to FIG. 12 to FIG. 14 to describe the connection between the conductor layers and the terminal electrodes 211 to 214 in detail. As shown in FIG. 13, at the side surface 201c of the device main body 201B, the end face 241E of the lower conductor layer 241 and the end face 271E of the upper conductor layer 271 are electrically and physically connected to each other. As a result, the end faces 241E and 271E form one contiguous terminal connecting surface 291c. As shown in FIG. 13, at the side surface 201d of the device main body 201B, the end face 242E of the lower conductor layer 242 and the end face 272E of the upper conductor layer 272 are electrically and physically connected to each other. As a result, the end faces 242E and 272E form one contiguous terminal connecting surface 291d. As shown in FIG. 12, at the side surface 201e of the device main body 201B, the end face 243E of the lower conductor layer 243 and the end face 273E of the upper conductor layer 273 are electrically and physically connected to each other. As a result, the end faces 243E and 273E form one contiguous terminal connecting surface 291e. As shown in FIG. 12, at the side surface 201f of the device main body 201B, the end face 244E of the lower conductor layer 244 and the end face 274E of the upper conductor layer 274 are electrically and physically connected to each other. As a result, the end faces 244E and 274E form one contiguous terminal connecting surface 291f.

As shown in FIG. 13, the terminal electrode 211 is disposed to touch a portion of the side surface 201c and a portion of the bottom surface 201b contiguous to the side surface 201c of the device main body 201B. The terminal electrode 211 is smaller in width than the side surface 201c. The terminal electrode 211 touches the end faces 241E and 271E, that is, the terminal connecting surface 291c, and is thereby connected to the conductor layers 241 and 271. A portion of the terminal electrode 211 is placed in the concave portion 208c of the protection film 208 and thereby touches a portion of the top surface of the upper conductor layer 271.

As shown in FIG. 13, the terminal electrode 212 is disposed to touch a portion of the side surface 201d and a portion of the bottom surface 201b contiguous to the side surface 201d of the device main body 201B. The terminal electrode 212 is smaller in width than the side surface 201d. The terminal electrode 212 touches the end faces 242E and 272E, that is, the terminal connecting surface 291d, and is thereby connected to the conductor layers 242 and 272. A portion of the terminal electrode 212 is placed in the concave portion 208d of the protection film 208 and thereby touches a portion of the top surface of the upper conductor layer 272.

As shown in FIG. 12, the terminal electrode 213 is disposed to touch a portion of the side surface 201e and a portion of the bottom surface 201b contiguous to the side surface 201e of the device main body 201B. The terminal electrode 213 is smaller in width than the side surface 201e. The terminal electrode 213 touches the end faces 243E and 273E, that is, the terminal connecting surface 291e, and is thereby connected to the conductor layers 243 and 273. A portion of the terminal electrode 213 is placed in the concave portion 208e of the protection film 208 and thereby touches a portion of the top surface of the upper conductor layer 273.

As shown in FIG. 12, the terminal electrode 214 is disposed to touch a portion of the side surface 201f and a portion of the bottom surface 201b contiguous to the side surface 201f of the device main body 201B. The terminal electrode 214 is smaller in width than the side surface 201f. The terminal electrode 214 touches the end faces 244E and 274E, that is, the terminal connecting surface 291f, and is thereby connected to the conductor layers 244 and 274. A portion of the terminal electrode 214 is placed in the concave portion 208f of the protection film 208 and thereby touches a portion of the top surface of the upper conductor layer 274.

The terminal electrodes 211 to 214 do not extend out of the concave portions 208c to 208f, respectively, and do not reach over the protection film 208. In the example shown in FIG. 12 to FIG. 14, there is no space between respective edges of the concave portions 208c to 208f and the respective portions of the terminal electrodes 211 to 214 disposed in the concave portions 208c to 208f. Furthermore, in this example, the top surface of the protection film 208 and the top surfaces of the terminal electrodes 211 to 214 form a contiguous flat surface. In this case, the top surface of the thin-film device 201 is flat. It suffices that portions of the terminal electrodes 211 to 214 are disposed in the concave portions 208c to 208f, respectively, and there may be a space between the respective edges of the concave portions 208c to 208f and the respective portions of the terminal electrodes 211 to 214. Furthermore, there may be a difference in level between the top surface of the protection film 208 and the top surface of each of the terminal electrodes 211 to 214.

It is not necessarily required that the terminal electrodes 211 to 214 be located on the bottom surface 201b of the device main body 201B. Furthermore, the lower end face of each of the terminal electrodes 211 to 214 may be located at an arbitrary level between the lower surface of the lower conductor layer and the bottom surface 201b of the device main body 201B.

A method of manufacturing the thin-film device 201 of the second embodiment is similar to the method of manufacturing the thin-film device 1 of the first embodiment.

Effects of the thin-film device 201 of the embodiment will now be described. The thin-film device 201 of the embodiment incorporates the device main body 201B and the terminal electrodes 211 to 214. The device main body 201B includes: the lower conductor layers 241 to 245 and the upper conductor layers 271 to 274, the lower and upper conductor layers being located at different levels along the direction in which the layers are stacked; and the insulating layer 205 disposed between two of the conductor layers that are adjacent to each other along the direction in which the layers are stacked. In addition, the device main body 201B has the side surfaces 201c to 201f. The terminal electrodes 211 to 214 are disposed to touch the side surfaces 201c to 201f, respectively. The device main body 201B incorporates the capacitors 311 and 312 and the inductors 321 and 322 each of which is a passive element formed using at least one of the conductor layers.

The lower conductor layer 244 used to form the inductor 322 has the end face 244E located at the side surface 201f. The upper conductor layer 274 used to form the inductor 321 and located at a level different from the level at which the lower conductor layer 244 is located along the direction in which the layers are stacked has the end face 274E located at the side surface 201f. At the side surface 201f, the end faces 244E and 274E are electrically and physically connected to each other. As a result, the end faces 244E and 274E form the one contiguous terminal connecting surface 291f. The terminal electrode 214 touches the end faces 244E and 274E, that is, the terminal connecting surface 291f, and is thereby connected to the conductor layers 244 and 274. The inductor 322 corresponds to the first passive element of the invention. The inductor 321 corresponds to the second passive element of the invention. The lower conductor layer 244 corresponds to the first conductor layer of the invention. The upper conductor layer 274 corresponds to the second conductor layer of the invention.

The upper conductor layer 271 used to form the capacitor 311 has the end face 271E located at the side surface 201c. The lower conductor layer 241 that is not used to form any passive element and that is located at a level different from the level at which the upper conductor layer 271 is located along the direction in which the layers are stacked has the end face 241E located at the side surface 201c. At the side surface 201c, the end faces 241E and 271E are electrically and physically connected to each other. As a result, the end faces 241E and 271E form the one contiguous terminal connecting surface 291c. The terminal electrode 211 touches the end faces 241E and 271E, that is, the terminal connecting surface 291c, and is thereby connected to the conductor layers 241 and 271. The upper conductor layer 271 corresponds to the first conductor layer of the invention. The lower conductor layer 241 corresponds to the second conductor layer of the invention.

The upper conductor layer 272 used to form the capacitor 312 and the inductor 322 has the end face 272E located at the side surface 201d. The lower conductor layer 242 that is not used to form any passive element and that is located at a level different from the level at which the upper conductor layer 272 is located along the direction in which the layers are stacked has the end face 242E located at the side surface 201d. At the side surface 201d, the end faces 242E and 272E are electrically and physically connected to each other. As a result, the end faces 242E and 272E form the one contiguous terminal connecting surface 291d. The terminal electrode 212 touches the end faces 242E and 272E, that is, the terminal connecting surface 291d, and is thereby connected to the conductor layers 242 and 272. The upper conductor layer 272 corresponds to the first conductor layer of the invention. The lower conductor layer 242 corresponds to the second conductor layer of the invention.

The lower conductor layer 243 that is not used to form any passive element has the end face 243E located at the side surface 201e. The upper conductor layer 273 that is not used to form any passive element and that is located at a level different from the level at which the lower conductor layer 243 is located along the direction in which the layers are stacked has the end face 273E located at the side surface 201e. At the side surface 201e, the end faces 243E and 273E are electrically and physically connected to each other. As a result, the end faces 243E and 273E form the one contiguous terminal connecting surface 291e. The terminal electrode 213 touches the end faces 243E and 273E, that is, the terminal connecting surface 291e, and is thereby connected to the conductor layers 243 and 273.

According to the embodiment, it is possible to increase the area of each of the regions in which the conductor layers touch the terminal electrodes 211 to 214, and to thereby enhance the reliability of connection between the conductor layers and the terminal electrodes 211 to 214. According to the embodiment, the respective two of the conductor layers used to form the terminal connecting surfaces 291c to 291f are not those used to form an identical passive element. As a result, in order to form the terminal connecting surfaces 291c to 291f, it is not necessary to make the number of conductor layers used to form a single passive element greater than required, and consequently, it is possible to reduce the size and profile of the thin-film device 201.

According to the embodiment, the maximum number of the conductor layers aligned along the direction in which the layers are stacked is two, which is the minimum number required to form the terminal connecting surfaces 291c to 291f. As a result, it is possible to reduce the size and profile of the thin-film device 201, in particular. The remainder of effects of the second embodiment are similar to those of the first embodiment.

The present invention is not limited to the foregoing embodiments but may be practiced in still other ways. For example, the combination of the first and second passive elements of the invention may be a combination of a capacitor and an inductor.

The thin-film device of the invention may include a semiconductor layer and/or a magnetic layer in addition to the conductor layers. Furthermore, the number of terminal electrodes of the thin-film device of the invention is not limited to four but may be any number.

The invention is applicable not only to thin-film devices having the function of a low-pass filter disclosed in the first embodiment and thin-film devices having the function of a high-pass filter disclosed in the second embodiment, but also to thin-film devices in general incorporating conductor layers and terminal electrodes connected to the conductor layers. Functions of thin-film devices to which the invention is applicable include those of passive elements such as a capacitor and an inductor, active elements such as a transistor, and circuits including a plurality of elements. Specifically, such circuits include an LC circuit component, various sorts of filters such as a low-pass filter, a high-pass filter and a band-pass filter, a diplexer, and a duplexer.

The thin-film device of the invention is utilized for a mobile communications apparatus such as a cellular phone and a communications apparatus for a wireless local area network (LAN).

Obviously many modifications and variations of the present invention are possible in the light of the above teachings. It is therefore to be understood that within the scope of the appended claims the invention may be practiced otherwise than as specifically described.

What is claimed is:

1. A thin-film device comprising:
a layered structure including a plurality of conductor layers disposed at different levels along a direction in which the layers are stacked and an insulating layer disposed between two of the conductor layers located adjacent to each other along the direction in which the layers are stacked, the layered structure having a top surface and a bottom surface located at opposite ends in the direction in which the layers are stacked, and a side surface coupling the top surface and the bottom surface to each other; and
a terminal electrode disposed to touch the side surface of the layered structure, wherein:
the layered structure incorporates a passive element formed using at least one of the conductor layers;
the plurality of conductor layers include a lower conductor layer that is not used to form the passive element, and an upper conductor layer that is used to form the passive element and that is disposed above the lower conductor layer;
each of the upper conductor layer and the lower conductor layer includes a lead electrode portion having an end face located at the side surface of the layered structure;
the insulating layer is disposed between the upper conductor layer and the lower conductor layer and has a concave portion having a shape that is recessed inward from an outer edge of the insulating layer;
the concave portion exposes a top surface of the lead electrode portion of the lower conductor layer;
the lead electrode portion of the upper conductor layer touches the top surface of the lead electrode portion of the lower conductor layer through the concave portion, and is thereby directly connected to the lead electrode portion of the lower conductor layer; and
at the side surface of the layered structure, the end face of the lead electrode portion of the lower conductor layer and the end face of the lead electrode portion of the upper conductor layer are directly connected to each other electrically and physically, thereby forming one contiguous terminal connecting surface along substantially an entire length of the end face of the lead electrode portion of the lower conductor layer and the end face of the lead electrode portion of the upper conductor layer, and the terminal electrode touches the one contiguous terminal connecting surface and is thereby connected to the upper conductor layer and the lower conductor layer.

2. The thin-film device according to claim 1, wherein the maximum number of the conductor layers aligned along the direction in which the layers are stacked is two.

* * * * *